United States Patent
Otsuji et al.

(10) Patent No.: US 12,402,427 B2
(45) Date of Patent: Aug. 26, 2025

(54) IMAGING DEVICE HAVING A PLURALITY OF IN-LAYER LENSES WITH CORRESPONDING ON-CHIP LENSES

(71) Applicant: Sony Semiconductor Solutions Corporation, Kanagawa (JP)

(72) Inventors: Hironari Otsuji, Kanagawa (JP); Hiroyuki Kawano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 501 days.

(21) Appl. No.: 17/299,901

(22) PCT Filed: Nov. 12, 2019

(86) PCT No.: PCT/JP2019/044250
§ 371 (c)(1),
(2) Date: Jun. 4, 2021

(87) PCT Pub. No.: WO2020/137203
PCT Pub. Date: Jul. 2, 2020

(65) Prior Publication Data
US 2022/0028912 A1    Jan. 27, 2022

(30) Foreign Application Priority Data
Dec. 26, 2018    (JP) ................. 2018-242282

(51) Int. Cl.
*H10F 39/00*    (2025.01)
*G02B 3/00*    (2006.01)
(Continued)

(52) U.S. Cl.
CPC ....... *H10F 39/8063* (2025.01); *G02B 3/0037* (2013.01); *G02B 5/208* (2013.01);
(Continued)

(58) Field of Classification Search
CPC ......... H01L 27/14627; H01L 27/14621; H01L 27/14645; G02B 3/0037; G02B 5/208
See application file for complete search history.

(56) References Cited

U.S. PATENT DOCUMENTS 7,948,555 B2    5/2011    Kwon
2007/0210345 A1*  9/2007  Oda ............... H01L 27/14643
                                                257/E27.133
(Continued)

FOREIGN PATENT DOCUMENTS

CN    1574377 A    2/2005
CN    101069107 A    11/2007
(Continued)

OTHER PUBLICATIONS

International Search Report issued in International Patent Application No. PCT/JP2019/044250 on Feb. 10, 2020 and English translation of same. 7 pages.

(Continued)

Primary Examiner — Herve-Louis Y Assouman
(74) Attorney, Agent, or Firm — K&L Gates LLP

(57) ABSTRACT

The deterioration of the image quality of an imaging element is to be prevented.

The imaging element includes an on-chip lens, a photoelectric conversion unit, and a plurality of in-layer lenses. The on-chip lens collects incident light from a subject. The photoelectric conversion unit performs photoelectric conversion on the collected incident light. The plurality of in-layer lenses that is arranged between the on-chip lens and the photoelectric conversion unit and that is configured to further collect the incident light that has passed through the on-chip lens. Furthermore, the plurality of in-layer lenses (Continued)

allows the incident light that has passed through any one of the plurality of in-layer lenses to be incident on the photoelectric conversion unit.

14 Claims, 23 Drawing Sheets

(51) Int. Cl.
G02B 5/20 (2006.01)
H10F 39/12 (2025.01)
H10F 39/18 (2025.01)
(52) U.S. Cl.
CPC ......... *H10F 39/024* (2025.01); *H10F 39/182* (2025.01); *H10F 39/199* (2025.01); *H10F 39/8053* (2025.01); *H10F 39/8057* (2025.01)

(56) References Cited

U.S. PATENT DOCUMENTS

| | | | |
|---|---|---|---|
| 2009/0122178 A1 | 5/2009 | Kwon | |
| 2013/0037698 A1* | 2/2013 | Maeda | H10F 39/8053 257/E31.127 |
| 2014/0071244 A1* | 3/2014 | Hirota | H04N 13/257 348/46 |
| 2015/0070532 A1* | 3/2015 | Masuda | H10F 39/024 438/70 |
| 2015/0281538 A1* | 10/2015 | Boettiger | H04N 23/90 348/262 |
| 2016/0013233 A1* | 1/2016 | Noudo | H10F 39/199 438/69 |
| 2019/0081098 A1* | 3/2019 | Lenchenkov | G02B 13/0085 |

FOREIGN PATENT DOCUMENTS

| | | | |
|---|---|---|---|
| CN | 101292177 A | 10/2008 | |
| CN | 101853868 A | 10/2010 | |
| CN | 102693997 A | 9/2012 | |
| CN | 103000646 A | 3/2013 | |
| CN | 104900664 A | 9/2015 | |
| CN | 105009288 A | 10/2015 | |
| JP | 2001094086 A | 4/2001 | |
| JP | 2004356269 A | 12/2004 | |
| JP | 2005011969 A | 1/2005 | |
| JP | 2007158109 A | 6/2007 | |
| JP | 2007242857 A | 9/2007 | |
| JP | 2010239003 A | 10/2010 | |
| JP | 2010283082 | * 12/2010 | ....... H01L 27/14627 |
| JP | 2010283082 A | * 12/2010 | ....... H01L 27/14627 |
| JP | 2011146608 A | 7/2011 | |
| JP | 2012204354 A | 10/2012 | |
| JP | 2013004635 A | 1/2013 | |
| JP | 2014075445 A | * 4/2014 | ......... H10F 39/8063 |
| JP | 2015167219 A | 9/2015 | |
| JP | 2015170620 A | 9/2015 | |
| JP | 2016-201397 A | 12/2016 | |
| JP | 2017034280 A | 2/2017 | |
| JP | 2017041474 A | 2/2017 | |
| JP | 2018046145 A | 3/2018 | |
| JP | 2018-201601 A | 12/2018 | |
| JP | 2018201061 A | 12/2018 | |
| KR | 100731094 B1 | * 6/2007 | |
| TW | 201724484 A | 7/2017 | |
| WO | WO-2014156704 A1 | 10/2014 | |
| WO | WO-2016114154 A1 | 7/2016 | |
| WO | WO-2018051604 A1 | * 3/2018 | ....... H01L 27/14605 |
| WO | WO2018/173872 A1 | 9/2018 | |
| WO | WO-2018211813 A1 | * 11/2018 | ............. G02B 5/201 |

OTHER PUBLICATIONS

Written Opinion issued in International Patent Application No. PCT/JP2019/044250 on Feb. 10, 2020. 5 pages.

* cited by examiner

A

B

C

A

B

A

B

C

A

B

A

B

A

B

IMAGING DEVICE HAVING A PLURALITY OF IN-LAYER LENSES WITH CORRESPONDING ON-CHIP LENSES

TECHNICAL FIELD

The present disclosure relates to an imaging element and an imaging apparatus. Specifically, the present disclosure relates to an imaging element that includes an on-chip lens and an in-layer lens, and an imaging apparatus that includes the imaging element.

BACKGROUND ART

As an imaging element in which pixels that convert incident light to image signals are arranged in a two-dimensional grid, a rear surface irradiation type imaging element has been conventionally used. This rear surface irradiation type imaging element is an imaging element in which a semiconductor substrate is irradiated with incident light from its rear surface side, the rear surface being different from a surface (front surface) of the semiconductor substrate in which a wiring region is formed. This can improve sensitivity in comparison with an imaging element that is irradiated with incident light from its front surface side. In the rear surface irradiation type imaging element, there is a case where incident light passes through the semiconductor substrate without being absorbed in the semiconductor substrate, and is reflected by a wiring layer of the wiring region. Especially, light having a long wavelength such as red light easily passes through the semiconductor substrate, so that an amount of light reflected by the wiring layer increases. When this reflected light is reflected outside the imaging element and incident on another pixel again, color mixture or the like occurs and image quality is degraded.

In addition, if a light amount of this reflected light changes in accordance with an incident angle of the incident light, the image quality is further degraded. This is because the light amount of the reflected light that is incident on another pixel changes in accordance with the incident angle, and then sensitivity of the pixel fluctuates. To reduce the degradation of the image quality, proposed is an imaging element in which wiring in a wiring layer is configured in a symmetric form about the center of a pixel (for example, refer to Patent Literature 1). In this imaging element, the symmetrically configured wiring can make the light amount of the reflected light from the pixel constant regardless of the incident angle.

CITATION LIST

Patent Document

Patent Document 1: Japanese Patent Application Laid-Open No. 2016-201397

SUMMARY OF THE INVENTION

Problems to be Solved by the Invention

The conventional technology described above has an issue of being incapable of reducing reflection of incident light from the wiring layer and of preventing the degradation of the image quality.

The present disclosure has been made in view of the above issue, and is directed to prevention of the deterioration of the image quality.

Solutions to Problems

The present disclosure is provided to solve the above problem, and a first aspect of the present disclosure is an imaging element, including an on-chip lens configured to collect incident light from a subject, a photoelectric conversion unit configured to perform photoelectric conversion on the collected incident light, and a plurality of in-layer lenses that is arranged between the on-chip lens and the photoelectric conversion unit and that is configured to further collect the incident light that has passed through the on-chip lens, in which the plurality of in-layer lenses is configured to allow the incident light that has passed through any one of the plurality of in-layer lenses to be incident on the photoelectric conversion unit.

Furthermore, in this first aspect, the plurality of in-layer lenses may be arranged in substantially an identical layer.

Furthermore, in this first aspect, the plurality of in-layer lenses may be simultaneously formed.

Furthermore, in this first aspect, a color filter configured to allow light having a predetermined wavelength, out of the incident light that has passed through the on-chip lens, to transmit through the color filter, may further be included.

Furthermore, in this first aspect, the color filter may be configured to allow red light to transmit through the color filter.

Furthermore, in this first aspect, the color filter may be configured to cause infrared light to transmit through the color filter.

Furthermore, in this first aspect, one of the plurality of in-layer lenses may be arranged on an optical axis of the on-chip lens.

Furthermore, in this first aspect, the plurality of in-layer lenses may have mutually different shapes Furthermore, in this first aspect, a plurality of pixels each including the on-chip lens, the photoelectric conversion unit, and the plurality of in-layer lenses may further be included.

Furthermore, in this first aspect, the plurality of in-layer lenses may be arranged asymmetrically about a center of each pixel.

Furthermore, in this first aspect, a phase difference pixel that includes the on-chip lens and the photoelectric conversion unit, and that is configured to detect a phase difference by performing pupil division on the incident light from the subject may further be included.

Furthermore, a second aspect of the present disclosure is an imaging apparatus, including an on-chip lens configured to collect incident light from a subject, a photoelectric conversion unit configured to perform photoelectric conversion on the collected incident light, a plurality of in-layer lenses that is arranged between the on-chip lens and the photoelectric conversion unit and that is configured to further collect the incident light that has passed through the on-chip lens, and a processing circuit configured to process an image signal on the basis of the photoelectric conversion in the photoelectric conversion unit, in which the plurality of in-layer lenses is configured to allow the incident light that has passed through any one of the plurality of in-layer lenses to be incident on the photoelectric conversion unit.

Employing such aspects provides effects that incident light, which has passed through the on-chip lens, is individually collected by the plurality of in-layer lenses. A supposed case is that incident light is collected at different positions in the photoelectric conversion unit.

MODE FOR CARRYING OUT THE INVENTION

Subsequently, modes for carrying out the present disclosure (hereinafter referred to as embodiments) will be described with reference to the drawings. In the following drawings, an identical or similar part is denoted by an identical or similar reference sign. In addition, the embodiments will be described in the following order.

1. First Embodiment
2. Second Embodiment
3. Third Embodiment
4. Fourth Embodiment
5. Fifth Embodiment
6. Sixth Embodiment
7. Examples of practical use for camera
8. Examples of practical use for endoscopic surgery system
9. Examples of practical use for mobile objects 1. First Embodiment

[Configuration of Imaging Element]

Figure 1:
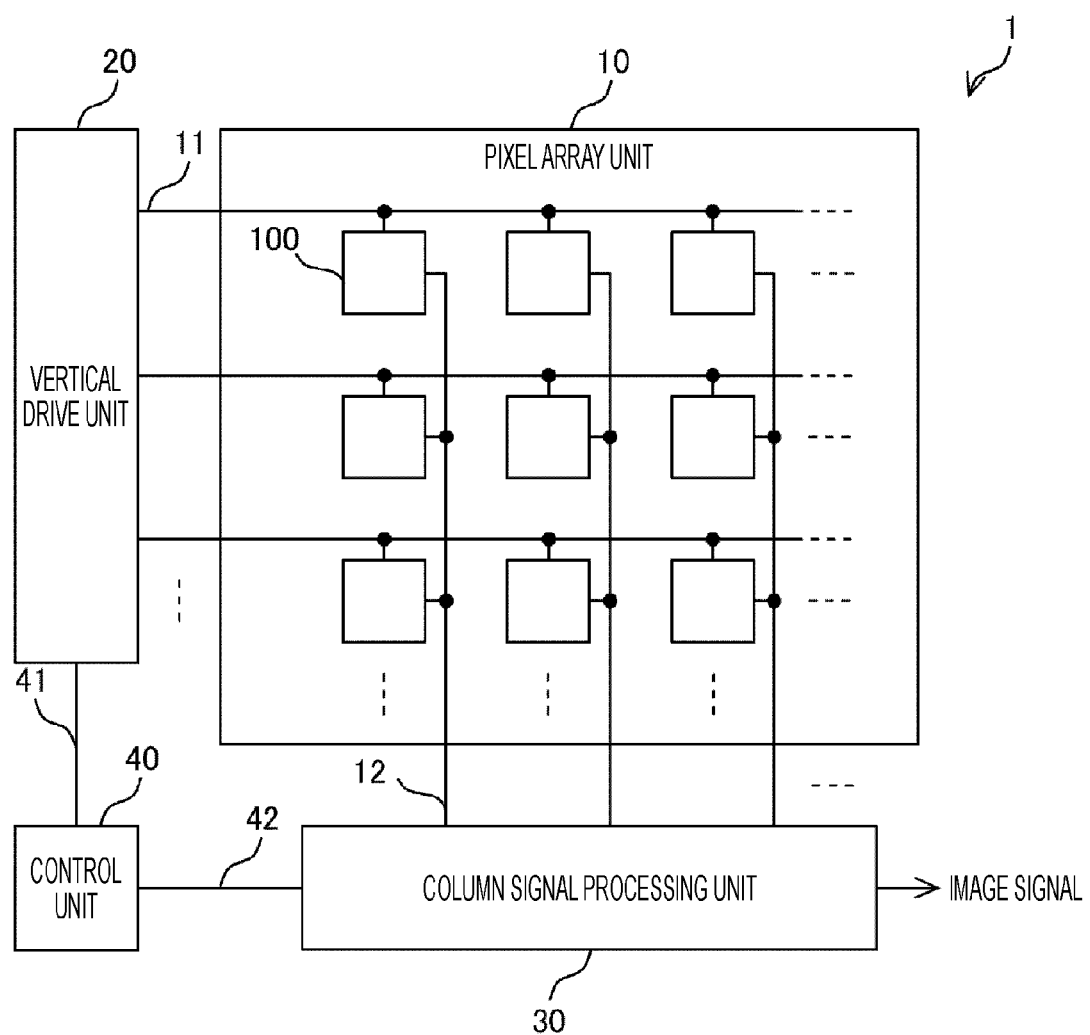
FIG. 1 is a diagram illustrating a configuration example of an imaging element according to embodiments of the present disclosure.

FIG. 1 is a diagram illustrating a configuration example of an imaging element according to embodiments of the present disclosure. An imaging element 1 illustrated in FIG. 1 includes a pixel array unit 10, a vertical drive unit 20, a column signal processing unit 30, and a control unit 40.

The pixel array unit 10 is configured by arranging pixels 100 in a two-dimensional grid. The pixel 100 mentioned herein generates an image signal in accordance with irradiated light. This pixel 100 includes a photoelectric conversion unit that generates a charge in accordance with irradiated light. In addition, the pixel 100 further includes a pixel circuit. This pixel circuit generates an image signal based on the charge generated by the photoelectric conversion unit. The generation of the image signal is controlled by a control signal generated by the vertical drive unit 20, which will be described later. In the pixel array unit 10, signal lines 11 and 12 are arranged in a XY matrix. The signal line 11 is a signal line that transmits a control signal for a pixel circuit in the pixel 100, is arranged on a row-by-row basis in the pixel array unit 10, and is wired in common to pixels 100 arranged in each row. The signal line 12 is a signal line that transmits an image signal generated by the pixel circuit in the pixel 100, is arranged on a column-by-column basis in the pixel array unit 10, and is wired in common to pixels 100 arranged in each column. The photoelectric conversion unit and the pixel circuit are formed on a semiconductor substrate.

The vertical drive unit 20 generates a control signal for the pixel circuit in the pixel 100. This vertical drive unit 20 transmits the generated control signal to the pixel 100 via the signal line 11 illustrated in FIG. 1. The column signal processing unit 30 performs processing on an image signal generated by the pixel 100. This column signal processing unit 30 performs the processing on the image signal transmitted from the pixel 100 via the signal line 12 illustrated in FIG. 1. The processing in the column signal processing unit 30 corresponds to, for example, analog-to-digital conversion to convert an analog image signal generated in the pixel 100 to a digital image signal. The image signal generated by the column signal processing unit 30 is output as an image signal of the imaging element 1. The control unit 40 controls the whole of the imaging element 1. This control unit 40 controls the imaging element 1 by generating and outputting a control signal that controls the vertical drive unit 20 and the column signal processing unit 30. The control signal generated by the control unit 40 is transmitted to the vertical drive unit 20 by a signal line 41 and transmitted to the column signal processing unit 30 by a signal line 42. Note that the column signal processing unit 30 is an example of a processing circuit described in the claims.

[Circuit Configuration of Pixel]

Figure 2:
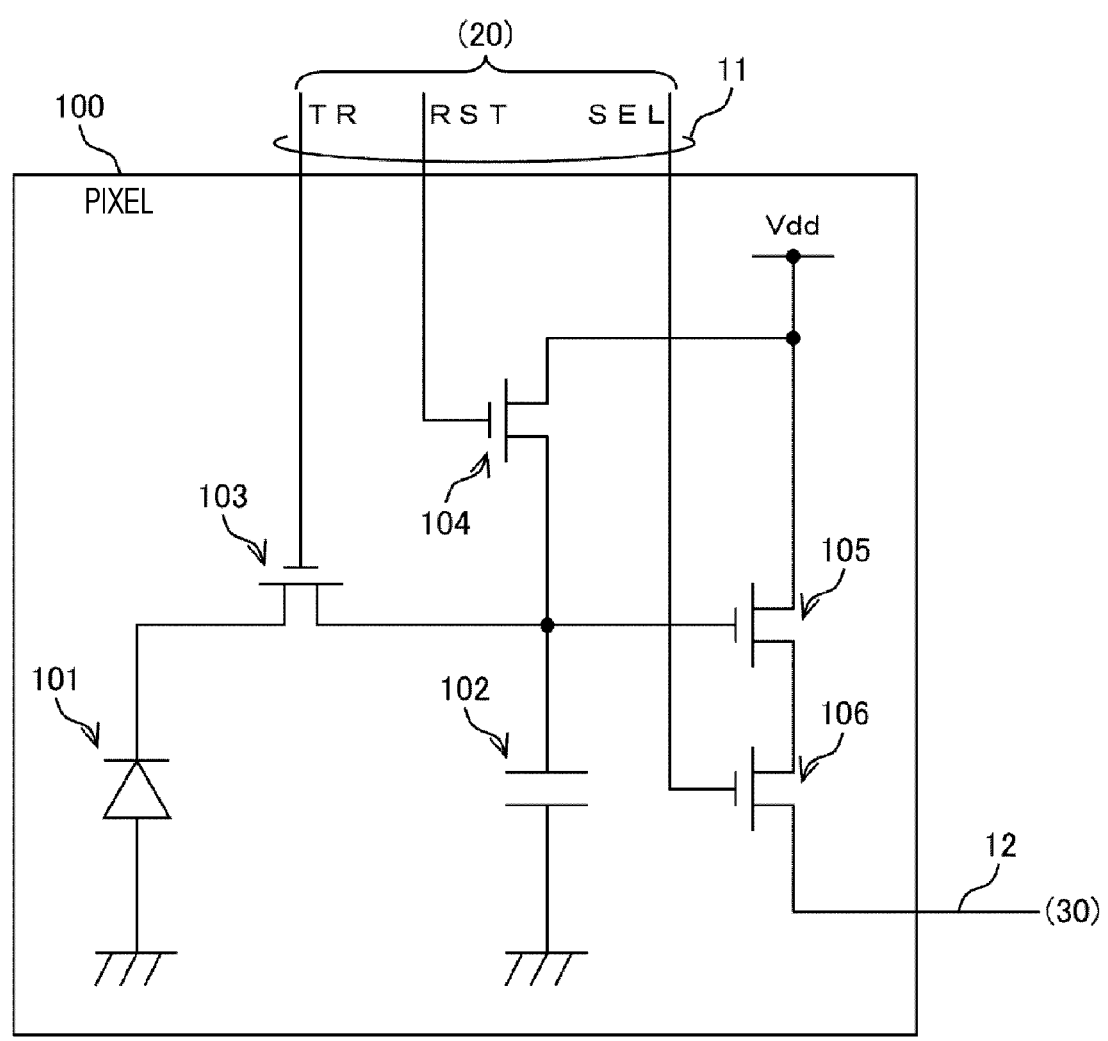
FIG. 2 is a diagram illustrating a configuration example of a pixel according to the embodiments of the present disclosure.

FIG. 2 is a diagram illustrating a configuration example of a pixel according to the embodiments of the present disclosure. FIG. 2 is a circuit diagram illustrating a configuration example of the pixel 100. The pixel 100 illustrated in FIG. 2 includes a photoelectric conversion unit 101, a charge holding unit 102, and metal oxide semiconductor (MOS) transistors 103 to 106.

The anode of the photoelectric conversion unit 101 is grounded, and the cathode thereof is connected to the source of the MOS transistor 103. The drain of the MOS transistor 103 is connected to the source of the MOS transistor 104, the gate of the MOS transistor 105, and one end of the charge holding unit 102. The other end of the charge holding unit 102 is grounded. The drains of the MOS transistors 104 and 105 are connected in common to a power supply line Vdd, and the source of the MOS transistor 105 is connected to the drain of the MOS transistor 106. The source of the MOS transistor 106 is connected to the signal line 12. The gates of the MOS transistors 103, 104, and 106 are connected to a transfer signal line TR, a reset signal line RST, and a selection signal line SEL, respectively. Note that the transfer signal line TR, the reset signal line RST, and the selection signal line SEL constitute the signal line 11.

The photoelectric conversion unit 101 generates a charge in accordance with irradiated light as described above. A photodiode can be used for this photoelectric conversion unit 101. In addition, the charge holding unit 102 and the MOS transistors 103 to 106 constitute the pixel circuit.

The MOS transistor 103 is a transistor that transfers a charge generated by photoelectric conversion performed by the photoelectric conversion unit 101 to the charge holding unit 102. The transfer of the charge by the MOS transistor 103 is controlled by a signal transmitted by the transfer signal line TR. The charge holding unit 102 is a capacitor that holds the charge transferred by the MOS transistor 103. The MOS transistor 105 is a transistor that generates a signal based on the charge held by the charge holding unit 102. The MOS transistor 106 is a transistor that outputs the signal generated by the MOS transistor 105 to the signal line 12 as an image signal. This MOS transistor 106 is controlled by a signal transmitted by the selection signal line SEL.

The MOS transistor 104 is a transistor that resets the charge holding unit 102 by discharging the charge held by the charge holding unit 102 to the power supply line Vdd. The resetting by this MOS transistor 104 is controlled by a signal transmitted by the reset signal line RST, and executed before the charge is transferred by the MOS transistor 103. Note that at the time of the resetting, it is possible to also reset the photoelectric conversion unit 101 by bringing the MOS transistor 103 into conduction. In this manner, the pixel circuit converts the charge generated by the photoelectric conversion unit 101 to the image signal.

[Configuration of Pixel]

Figure 3:
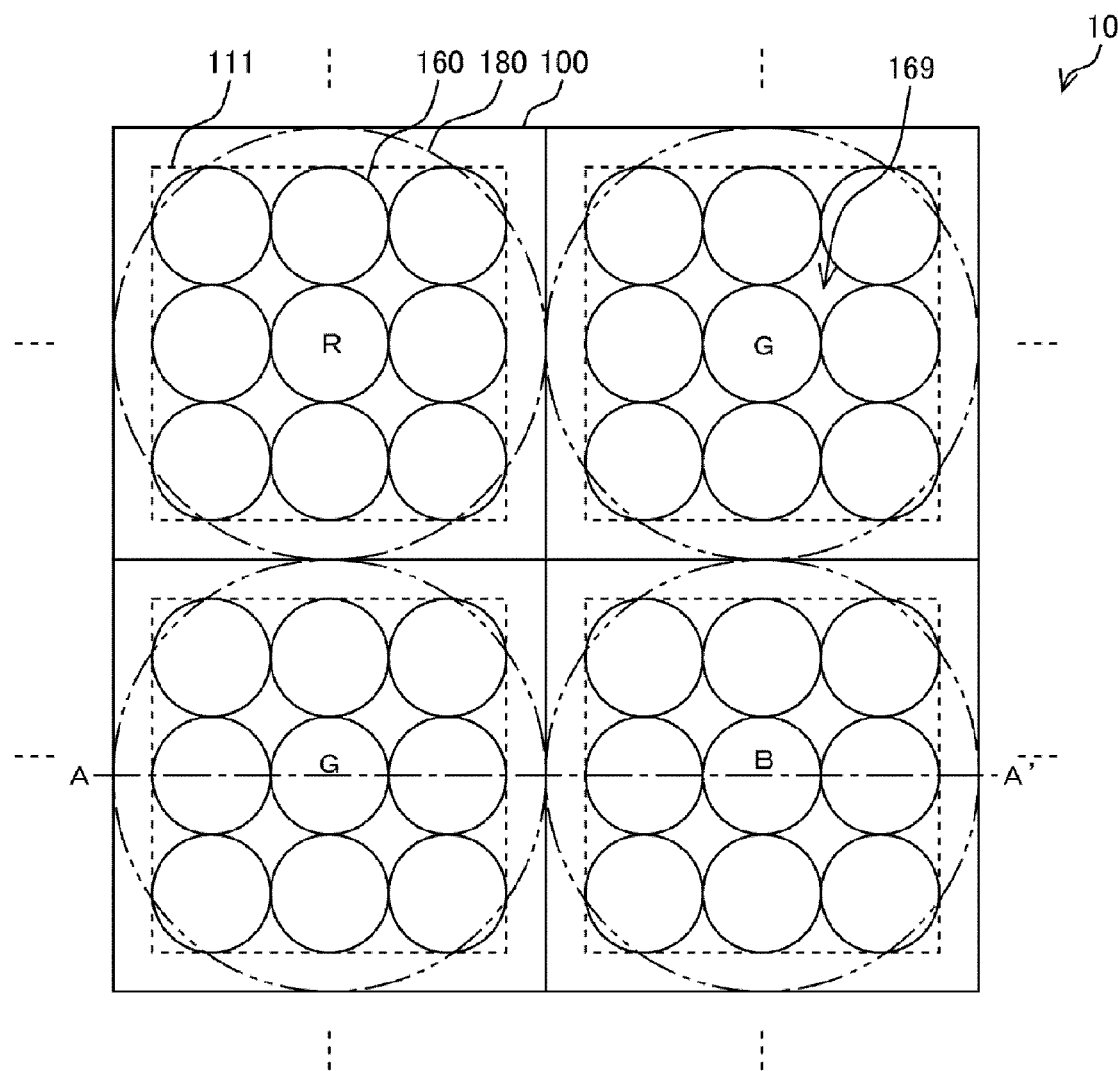
FIG. 3 is a plan view illustrating a configuration example of pixels according to a first embodiment of the present disclosure.

FIG. 3 is a plan view illustrating a configuration example of pixels according to a first embodiment of the present disclosure. FIG. 3 is a diagram illustrating a configuration example of the pixels 100 arranged in the pixel array unit 10. In FIG. 3, a rectangle in a solid line represents the pixel 100; a rectangle in a dotted line represents an n-type semiconductor region 111 constituting the photoelectric conversion unit 101; a circle in an alternate long and two short dashes line represents an on-chip lens 180; and a circle in a solid line represents an in-layer lens 160.

The on-chip lens 180 is a lens that is arranged in an outermost layer of the pixel 100 and that collects incident light from a subject on the photoelectric conversion unit 101.

The in-layer lens 160 is a lens that is arranged between the on-chip lens 180 and the photoelectric conversion unit 101 and that further collects the incident light collected by the on-chip lens 180. A plurality of the in-layer lenses 160 is arranged in each pixel 100. The pixel 100 illustrated in FIG. 3 represents an example in which nine in-layer lenses 160 are arranged in a grid. Note that a gap 169 is formed in the arranged plurality of in-layer lenses 160. Incident light that passes through the gap 169 is emitted to the photoelectric conversion unit 101 without passing through the in-layer lens 160. Details of the configuration of the pixel 100 will be described later.

Note that a color filter 172 (not illustrated) is arranged in the pixel 100. This color filter 172 is an optical filter that allows light having a predetermined wavelength, out of incident light, to pass therethrough. As the color filter 172, for example, color filters that allow red light, green light, and blue light to pass therethrough can be arranged in the respective pixels 100. Texts illustrated in FIG. 3 represent types of color filters 172 arranged in the pixels 100. Specifically, "R", "G", and "B" represent that the color filters 172 corresponding to red light, green light, and blue light, respectively, are arranged. These color filters 172 can be arranged, for example, in a Bayer array. The Bayer array mentioned herein is an array method of arranging the color filters 172 corresponding to green light in a checkered form, and arranging the color filters 172 corresponding to red light and blue light between the color filters 172 corresponding to green light. Four pixels 100 in two rows and two columns illustrated in FIG. 3 are consecutively arranged lengthwise and breadthwise to constitute the pixel array unit 10.

[Sectional Configuration of Pixel]

Figure 4:
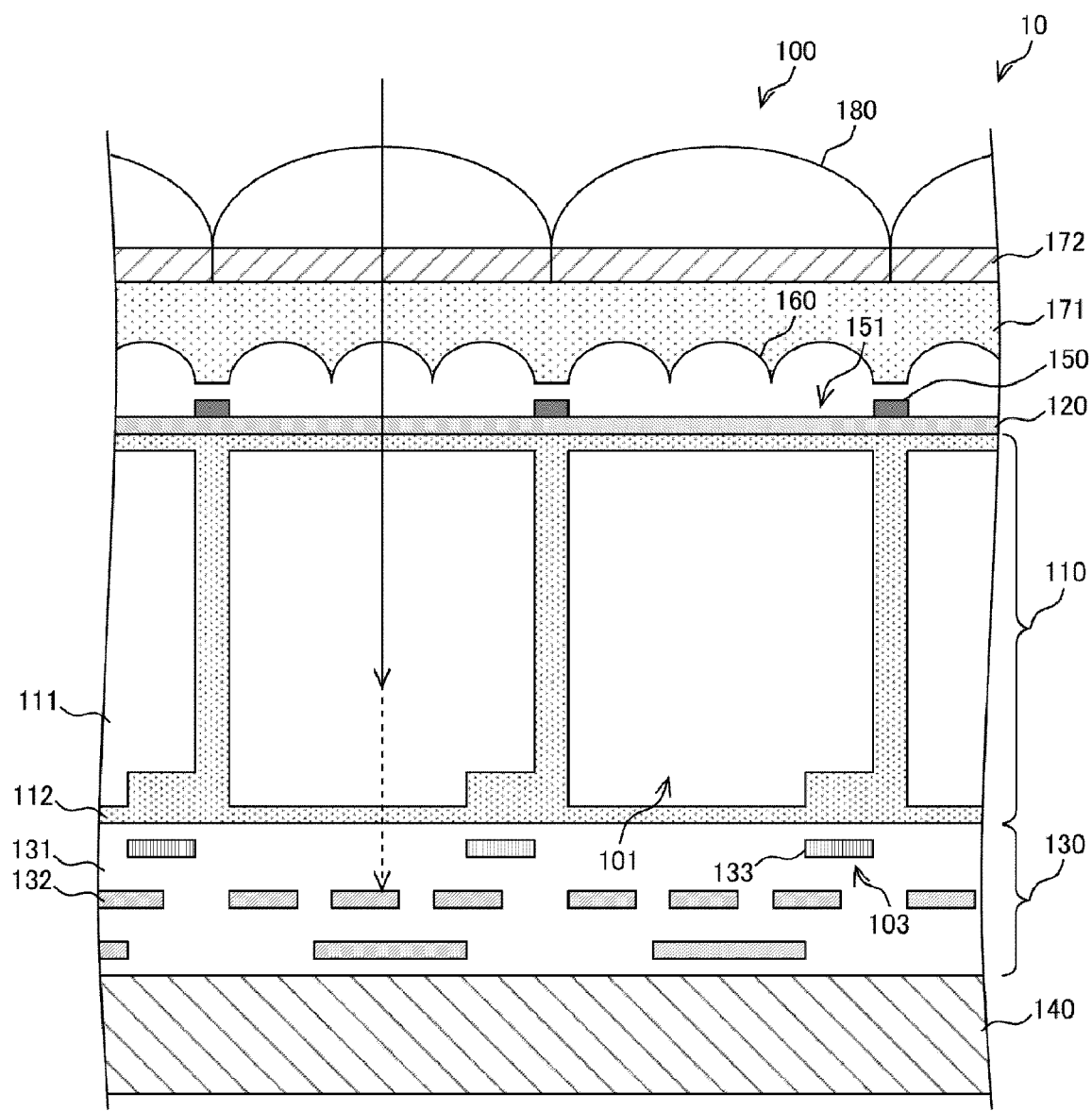
FIG. 4 is a sectional view illustrating a configuration example of a pixel according to the embodiments of the present disclosure.

FIG. 4 is a sectional view illustrating a configuration example of a pixel according to the embodiments of the present disclosure. FIG. 4 is a sectional view illustrating a configuration example of the pixel 100 arranged in the pixel array unit 10. In addition, FIG. 4 is a sectional view of the imaging element 1 (the pixel array unit 10) along a line A-A' illustrated in FIG. 3. The pixel 100 illustrated in FIG. 4 includes a semiconductor substrate 110, a wiring region 130, a support substrate 140, an insulating film 120, a light-shielding film 150, the in-layer lens 160, a planarizing film 171, the color filter 172, and the on-chip lens 180.

The semiconductor substrate 110 is a semiconductor substrate in which a semiconductor region for the elements constituting the pixel circuit described with reference to FIG. 2 is formed. FIG. 4 illustrates the photoelectric conversion unit 101 and the MOS transistor 103 among these elements. The semiconductor substrate 110 illustrated in FIG. 4 includes a p-type semiconductor region 112 constituting a well region and an n-type semiconductor region 111 formed inside the p-type semiconductor region 112. This n-type semiconductor region 111 constitutes the photoelectric conversion unit 101. Specifically, a p-n junction including the n-type semiconductor region 111 and the p-type semiconductor region 112 surrounding the n-type semiconductor region 111 operates as a photodiode. When this p-n junction is irradiated with incident light, a charge is generated by photoelectric conversion and accumulates in the n-type semiconductor region 111.

As described above, the charge that has accumulated in the n-type semiconductor region 111 is transferred by the MOS transistor 103. The MOS transistor 103 illustrated in FIG. 4 is a MOS transistor that uses the n-type semiconductor region 111 as a source region and the p-type semiconductor region 112 as a channel region. This MOS transistor 103 includes a gate electrode 133. The semiconductor substrate 110 can include, for example, silicon (Si). In addition, the vertical drive unit 20 or the like described with reference to FIG. 1 can be arranged on the semiconductor substrate 110.

The wiring region 130 is a region in which wiring that is formed on a front surface of the semiconductor substrate 110 and that electrically joins a semiconductor element formed on the semiconductor substrate 110 is formed. A wiring layer 132 and an insulating layer 131 are arranged in the wiring region 130. The wiring layer 132 constitutes the wiring described above. This wiring layer 132 can include, for example, copper (Cu) and tungsten (W). The insulating layer 131 insulates the wiring layer 132. This insulation layer 131 can include, for example, silicon oxide ($SiO_2$) or silicon nitride (SiN). In addition, the gate electrode 133 described above is further arranged in the wiring region 130.

The support substrate 140 is a substrate that supports the imaging element 1. This support substrate 140 is a substrate that includes a silicon wafer or the like and that increases strength of the imaging element 1 mainly at the time of manufacturing the imaging element 1.

The insulating film 120 is a film that insulates and protects a rear surface side of the semiconductor substrate 110. This insulating film 120 can include, for example, an oxide such as $SiO_2$.

The light-shielding film 150 is arranged in proximity to a boundary between pixels 100, and blocks incident light coming obliquely from adjacent pixels 100. The color filters 172 corresponding to different light are arranged in the adjacent pixels 100 as described with reference to FIG. 3. When incident light, which has passed through the different types of color filters 172 in the adjacent pixels 100, is emitted to the photoelectric conversion unit 101, color mixture occurs, and thus image quality is degraded. Arranging the light-shielding film 150 and blocking incident light from the adjacent pixels 100 can prevent the color mixture. An opening portion 151 is arranged in the light-shielding film 150 at a central portion of the pixel 100. Incident light is emitted to the photoelectric conversion unit 101 via this opening portion 151. For example, a film including W can be used for the light-shielding film 150.

The in-layer lens 160 is a lens that is formed in an inner layer of the pixel 100 and that collects incident light. A convex portion in a hemisphere shape illustrated in FIG. 4 corresponds to one in-layer lens 160. As described above, the plurality of in-layer lenses 160 is arranged in the pixel 100. These in-layer lenses 160 are arranged in parallel to a light path of incident light in the pixel 100. Specifically, the plurality of in-layer lenses 160 is arranged in a configuration that incident light, which has passed through one of these in-layer lenses 160, reaches the photoelectric conversion unit 101. The incident light reaches the photoelectric conversion unit 101 without passing through the plurality of in-layer lenses 160. In FIG. 4, the plurality of in-layer lenses 160 is arranged in substantially the same layer. In a case where the in-layer lenses 160 are arranged in the same layer just as described, these in-layer lenses 160 can also be formed simultaneously. Note that the configuration only needs to allow incident light, which has passed through one of the plurality of in-layer lenses 160, to reach the photoelectric conversion unit 101, and the plurality of in-layer lenses 160 can also be formed in different layers.

The in-layer lens 160 can include an inorganic material or a resin having a high refractive index. For example, the in-layer lens 160 can include SiN or silicon oxynitride (SiON). In addition, each of the in-layer lenses 160 can have a size of 0.8 μm to 1.0 μm in diameter, for example. The in-layer lenses 160 illustrated in FIG. 4 represent an example in which lower layer portions of the in-layer lenses 160 are formed with a common film. The lower layer portions of the in-layer lenses 160 planarize a rear surface of the imaging element 1 on which the light-shielding film 150 is formed.

The planarizing film 171 planarizes the rear surface of the imaging element 1 on which the in-layer lenses 160 are formed. This planarizing film 171 can include, for example, a resin. The color filter 172 and the on-chip lens 180 are laminated in an upper layer of the planarizing film 171.

The imaging element 1 illustrated in FIG. 4 corresponds to a rear surface irradiation type imaging element that is irradiated with incident light from the rear surface side of the semiconductor substrate 110. An arrow in a solid line illustrated in FIG. 4 represents incident light with which the rear surface is irradiated. In this manner, incident light, which has passed through the on-chip lens 180 and the in-layer lens 160, reaches the n-type semiconductor region 111 of the semiconductor substrate 110, and photoelectric conversion is performed. However, part of light incident on the semiconductor substrate 110 passes through the semiconductor substrate 110 without contributing to photoelectric conversion, and reaches the wiring region 130. An arrow in a broken line illustrated in FIG. 4 represents a state in which incident light passes through the semiconductor substrate 110. When this light that has passed therethrough is reflected by the wiring layer 132 and emitted to the outside of the pixel 100, it becomes stray light. When this stray light is reflected by a housing or the like outside the imaging element 1, incident on another pixel 100 again, and subjected to photoelectric conversion, noise occurs in image signals and image quality is degraded. For this reason, arranging the plurality of in-layer lenses 160 in the pixel 100 illustrated in FIG. 4 reduces reflected light from the wiring layer 132.

[Light Path of Incident Light]

Figure 5:
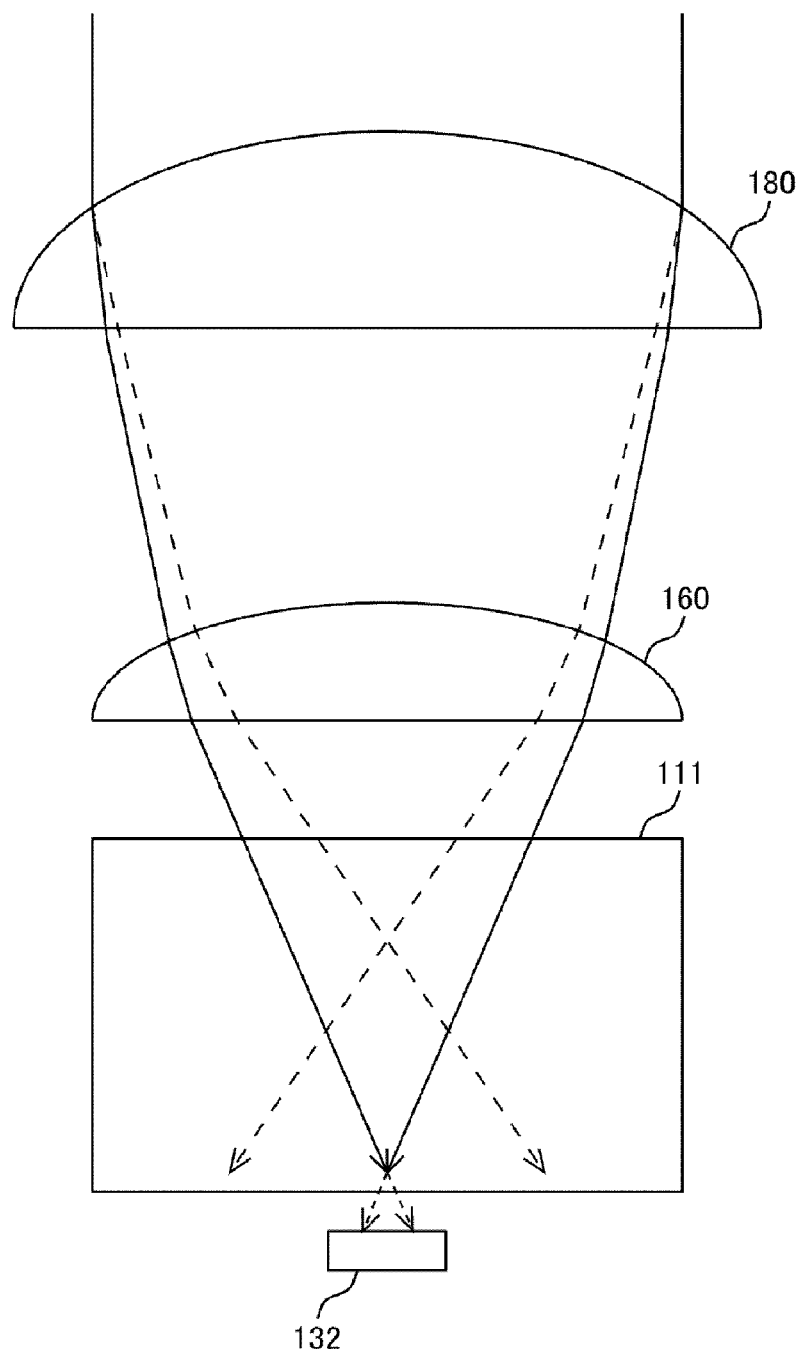
FIG. 5 is a diagram illustrating a light path of incident light in a conventional pixel.

FIG. 5 is a diagram illustrating a light path of incident light in a pixel according to a conventional technology. FIG. 5 is a diagram illustrating, as a comparative example, the light path of incident light in the pixel in which one in-layer lens 160 is arranged, and schematically illustrating the on-chip lens 180, the in-layer lens 160, the n-type semiconductor region 111, and the wiring layer 132. An arrow in a solid line illustrated in FIG. 5 represents incident light having a relatively long wavelength such as red light, and an arrow in a dotted line represents incident light having a relatively short wavelength such as blue light. The incident light is collected by the on-chip lens 180 and the in-layer lens 160 and reaches the photoelectric conversion unit 101 (n-type semiconductor region 111). The incident light being collected by the two lenses shortens a focal length, and thus can decrease a height of the imaging element 1. However, in a case where incident light is not absorbed in the n-type semiconductor region 111, i.e., not subjected to photoelectric conversion, it passes through the n-type semiconductor region 111, reaches the wiring layer 132 in the wiring region 130, and is reflected.

The incident light having the relatively short wavelength comes into focus at a shallow position of the n-type semiconductor region 111. In a case where the incident light is not absorbed in the n-type semiconductor region 111, it scatters and then reaches the wiring layer 132 of the wiring region 130. In contrast, the incident light having the relatively long wavelength comes into focus at a deep position of the n-type semiconductor region 111. For this reason, in a case where the incident light having the relatively long wavelength is not absorbed in the n-type semiconductor region 111, it reaches the wiring layer 132 while being concentrated in a relatively narrow range as illustrated by arrows in broken lines and is reflected. Consequently, incident light having a longer wavelength causes reflection with higher intensity.

Figure 6:
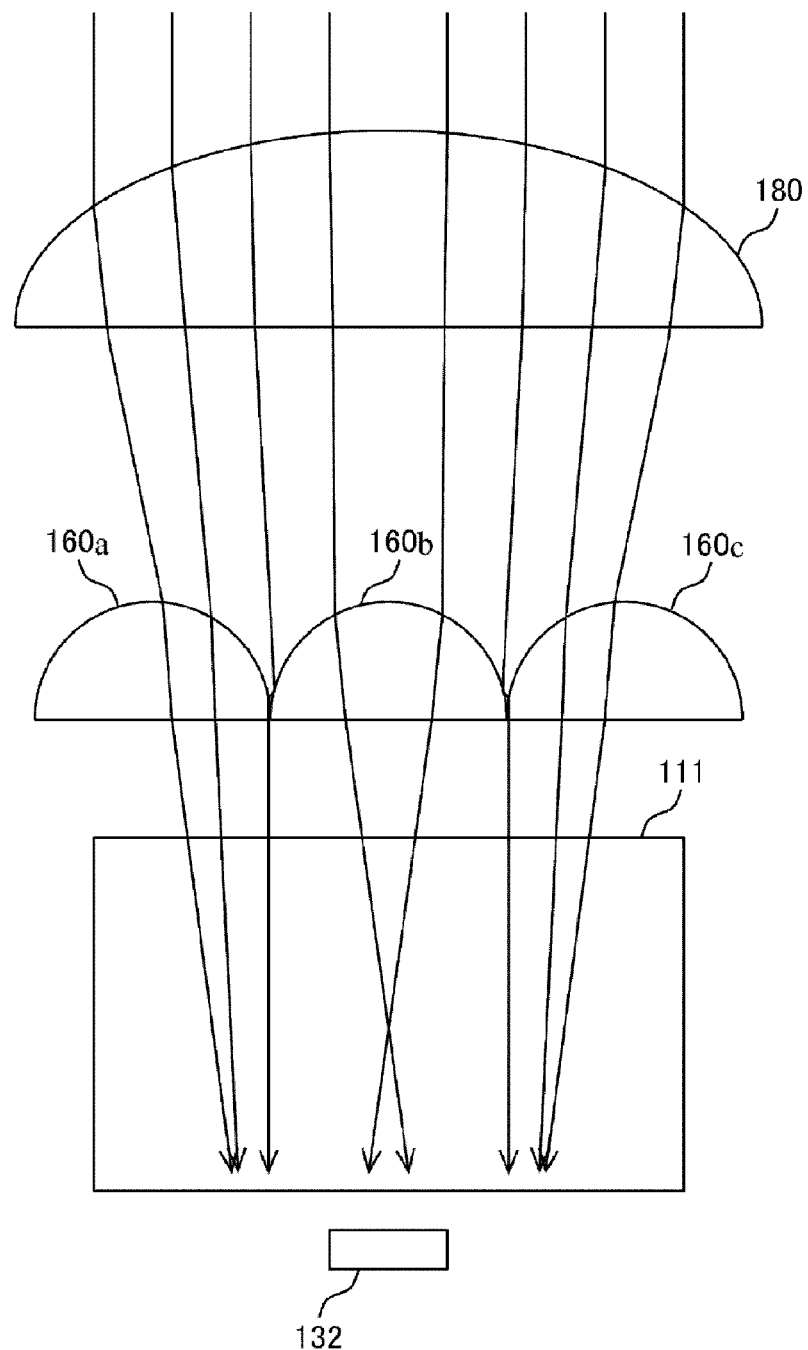
FIG. 6 is a diagram illustrating an example of a light path of incident light in the pixel according to the first embodiment of the present disclosure.

FIG. 6 is a diagram illustrating an example of a light path of incident light in the pixel according to the first embodiment of the present disclosure. The incident light, which has passed thorough the on-chip lens 180 illustrated in FIG. 6, is collected by a plurality of (three in FIG. 6) in-layer lenses 160a, 160b, and 160c, and emitted to the n-type semiconductor region 111. In addition, incident light, which has been emitted to a region in contact with two in-layer lenses 160, is repeatedly reflected between the two in-layer lenses 160, and thereafter emitted to the n-type semiconductor region 111. In this manner, the incident light is scattered by the in-layer lenses 160 and emitted to the n-type semiconductor region 111. In a case where the incident light is not absorbed in the n-type semiconductor region 111, it reaches the wiring layer 132 in a widely scattered state. As a result, an amount of reflected light can be reduced. In addition, because the incident light is scattered, it is possible to have a higher degree of flexibility in laying out the wiring layer 132. For example, the wiring layer 132 can be arranged immediately below a central portion of the photoelectric conversion unit 101.

In addition, it is preferable to employ a configuration in which one of the plurality of in-layer lenses 160 is arranged at the central portion of the pixel 100 like the in-layer lens 160b illustrated in FIG. 6. Specifically, one of the plurality of in-layer lenses 160 is arranged on an optical axis of the on-chip lens 180. Since incident light that has passed through the on-chip lens 180 is collected on the central portion of the pixel 100, a large amount of incident light that has passed through the on-chip lens 180 can be made pass through the in-layer lens 160. In comparison with to a case where the gap 169 is arranged on the optical axis of the on-chip lens 180, it is possible to scatter a larger amount of incident light.

[Manufacturing Method of Imaging Element]

Figure 7:
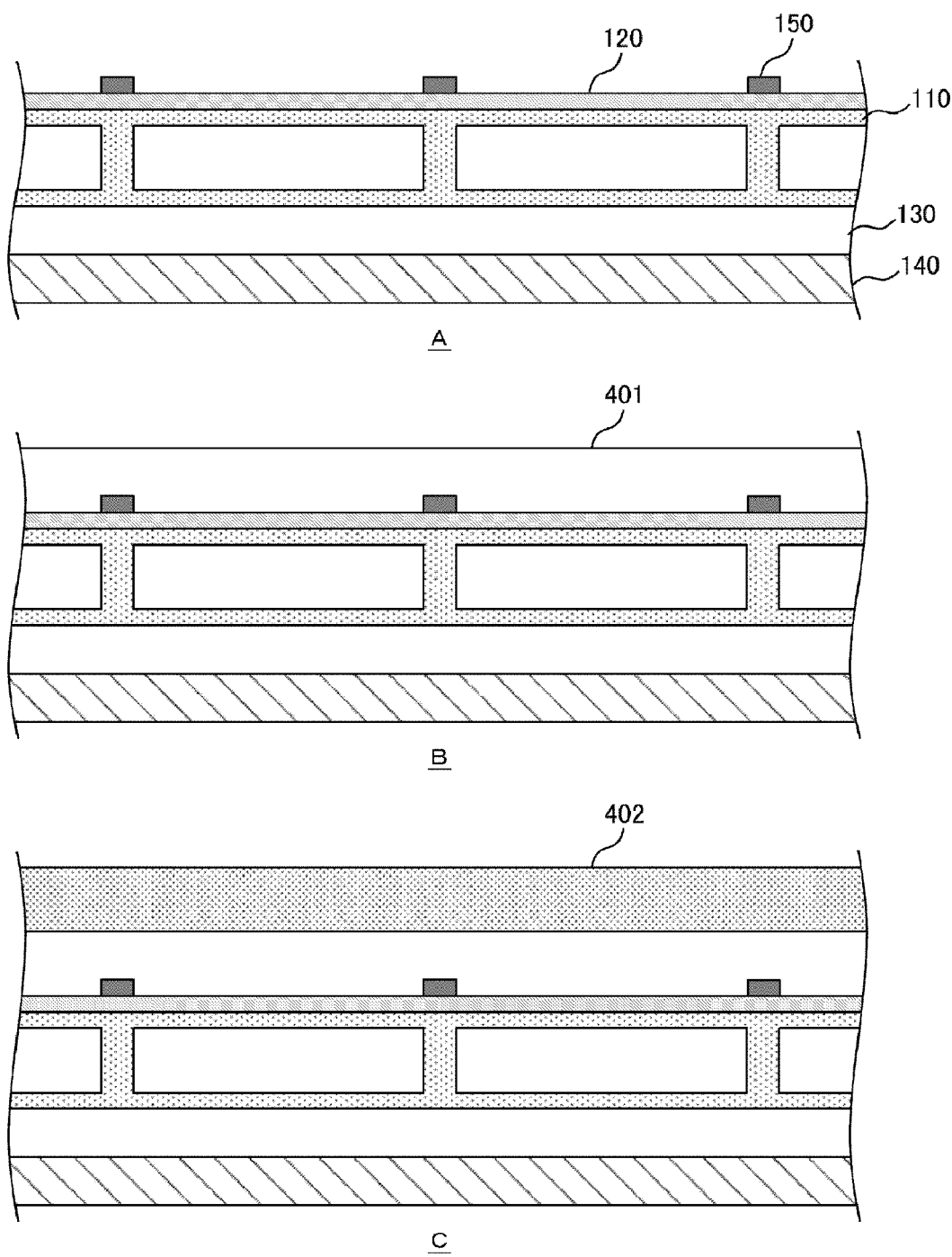
FIG. 7 is a diagram illustrating an example of a manufacturing method of the imaging element according to the embodiments of the present disclosure.
Figure 8:
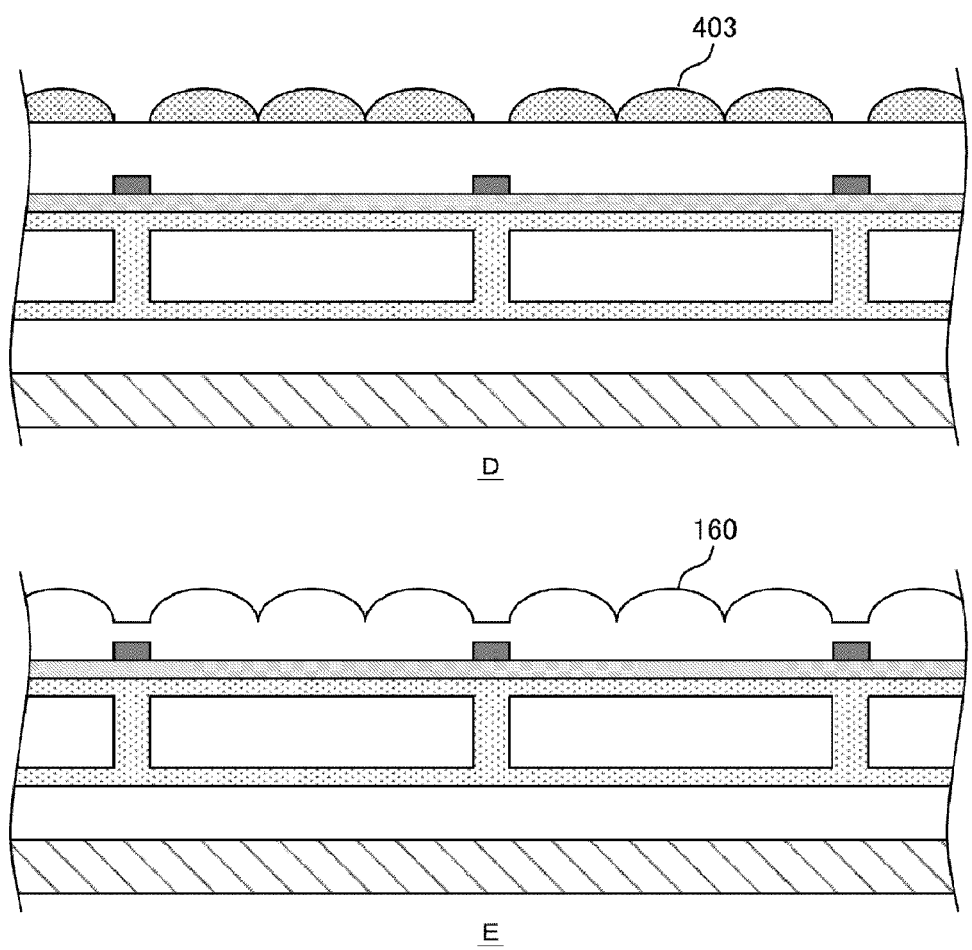
FIG. 8 is a diagram illustrating the example of the manufacturing method of the imaging element according to the embodiments of the present disclosure.

FIGS. 7 and 8 are diagrams illustrating the example of the manufacturing method of the imaging element according to the embodiments of the present disclosure. FIG. 7 is a diagram illustrating an example of a manufacturing process of the imaging element 1. In FIG. 7, illustration of the configuration of the pixel 100 is simplified.

First, the wiring region 130 is formed on the semiconductor substrate 110 in which the p-type semiconductor region 112 and the n-type semiconductor region 111 are formed. Subsequently, the support substrate 140 is bonded to the semiconductor substrate 110, the semiconductor substrate 110 is turned upside down, and the rear surface of the semiconductor substrate 110 is ground to decrease its wall thickness. Subsequently, the insulating film 120 and the light-shielding film 150 are arranged on the rear surface of the semiconductor substrate 110 (A in FIG. 7).

Subsequently, a lens material 401, which is a material of the in-layer lens 160, is arranged on the rear surface of the semiconductor substrate 110. Formation of the lens material 401 can be performed, for example, by film formation of a lens material such as SiN using chemical vapor deposition (CVD) (B in FIG. 7).

Subsequently, a resist 402 is laminated on the lens material 401. For example, a photoresist is employed for this resist 402, and the resist 402 can be formed by applying the photoresist on the lens material 401 (C in FIG. 7).

Subsequently, a resist 403 having a shape similar to that of the in-layer lens 160 is formed. The formation is performed, for example, by patterning the resist 402 in a cylindrical shape or a cube shape by a lithography technology. Thereafter, the resist 403 can be formed by dissolving the patterned resist 402 using a reflow furnace or the like (D in FIG. 8).

Subsequently, dry etching is performed using the resist 403 as a mask. With this processing, the shape of the resist 403 is transferred to the lens material 401, and the in-layer lens 160 in a hemisphere shape is formed (E in FIG. 8). Note that FIGS. 7 and 8 each illustrate an example of forming the plurality of in-layer lenses 160 simultaneously.

As described above, in the imaging element 1 according to the first embodiment of the present disclosure, arranging the plurality of in-layer lenses 160 allows incident light that has passed through the on-chip lens 180 to scatter, and allows the scattered light to be emitted to the photoelectric conversion unit 101. This reduces reflected light from the wiring layer 132, thereby preventing degradation of image quality.

2. Second Embodiment

The nine in-layer lenses 160 are arranged in the imaging element 1 according to the first embodiment described above. In contrast, an imaging element 1 according to a second embodiment of the present disclosure is different from the first embodiment in that different numbers of in-layer lenses 160 are arranged.

[Configuration of Pixel]

Figure 9:
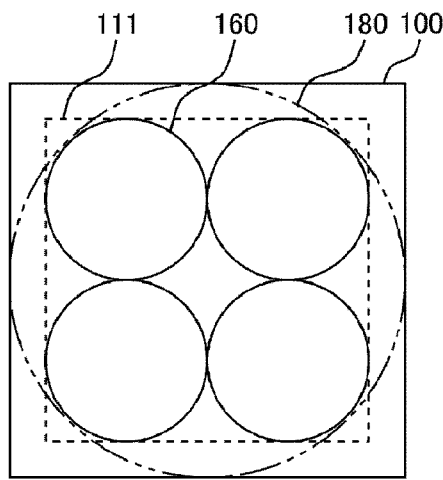
FIG. 9 is a plan view illustrating a configuration example of a pixel according to a second embodiment of the present disclosure.
Figure 9:
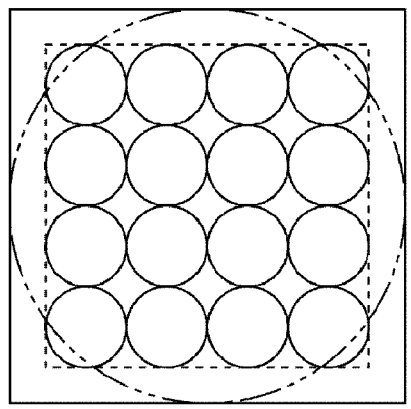
Figure 9:
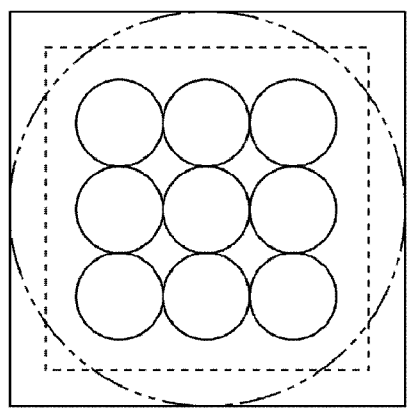

FIG. 9 is a plan view illustrating a configuration example of a pixel according to a second embodiment of the present disclosure. FIG. 9 is a diagram illustrating a configuration example of the pixel 100 similarly to FIG. 3. In the following description, reference signs of the same constituent elements as those illustrated in FIG. 3 are omitted.

A in FIG. 9 illustrates an example of arranging four in-layer lenses 160. In addition, B in FIG. 9 illustrates an example of arranging 16 in-layer lenses 160. In this manner, a freely-selected number of two or more in-layer lenses 160 can be arranged in the pixel 100. Arranging more in-layer lenses 160 can make the gap 169 between the in-layer lenses 160 smaller and scatter a larger amount of incident light. It is possible to arrange in-layer lenses 160, the number of which is in accordance with processing accuracy of the in-layer lenses 160 in the manufacturing process of the imaging element 1.

In addition, C in FIG. 9 illustrates an example of a case of arranging nine in-layer lenses 160 each having a relatively small diameter in proximity to the central portion of the pixel 100. Even in this case, it is possible to make the gap 169 small.

Since a configuration of the imaging element 1 other than the above is similar to the configuration of the imaging element 1 described in the first embodiment of the present disclosure, a description thereof is omitted.

As described above, in the imaging element 1 according to the second embodiment of the present disclosure, a freely-selected number of two or more in-layer lenses 160 can be arranged in accordance with processing accuracy.

3. Third Embodiment

Figure 10:
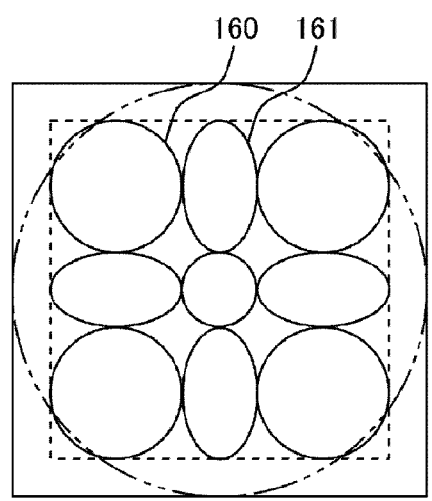
FIG. 10 is a plan view illustrating a first configuration example of a pixel according to a third embodiment of the present disclosure.
Figure 10:
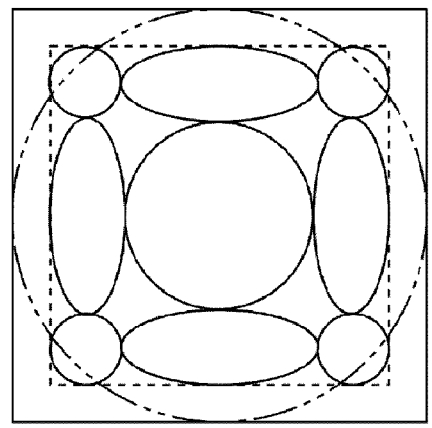
Figure 11:
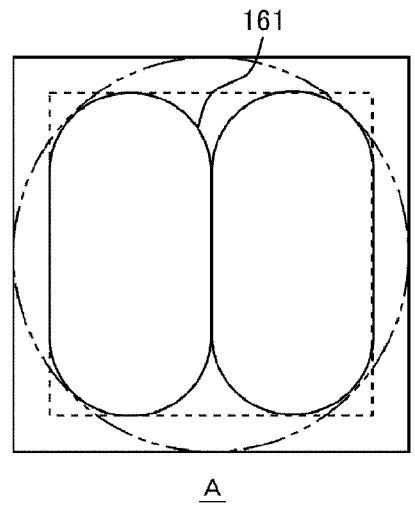
FIG. 11 is a plan view illustrating a second configuration example of the pixel according to the third embodiment of the present disclosure.
Figure 11:
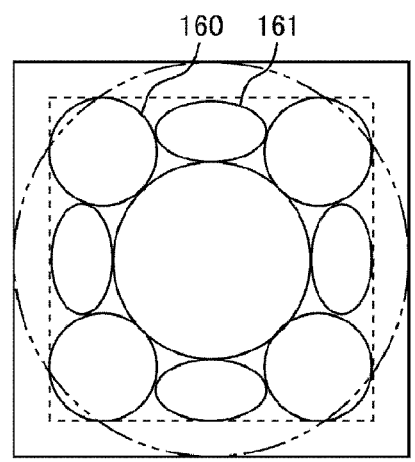
Figure 11:
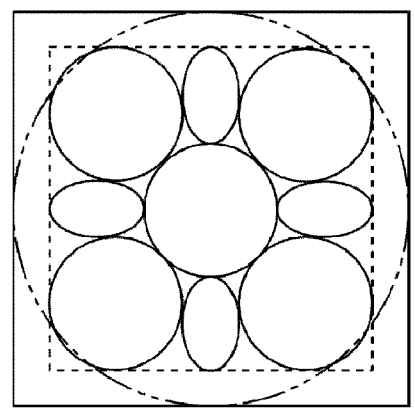
Figure 12:
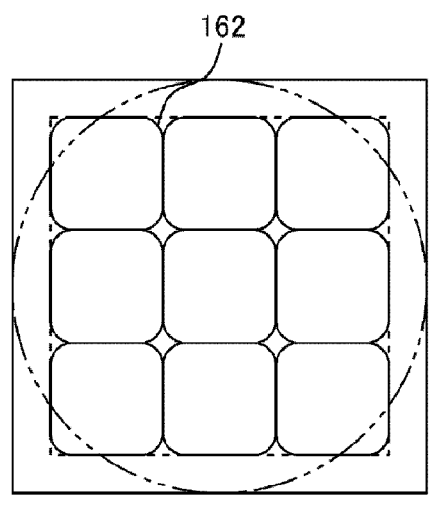
FIG. 12 is a plan view illustrating a third configuration example of the pixel according to the third embodiment of the present disclosure.
Figure 12:
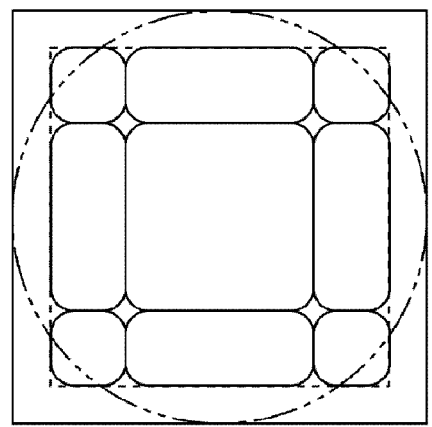
Figure 13:
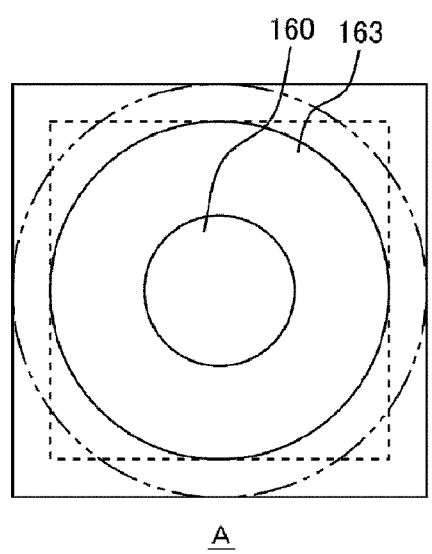
FIG. 13 is a plan view illustrating a fourth configuration example of the pixel according to the third embodiment of the present disclosure.
Figure 13:
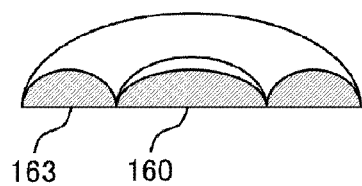

In the imaging element 1 according to the first embodiment, the in-layer lens 160 having a circular shape in a plan view is arranged. In contrast, an imaging element 1 according to a third embodiment of the present disclosure is different from the first embodiment in that in-layer lenses in different shapes are arranged.
[Configuration of Pixel 1]
FIG. 10 is a plan view illustrating a first configuration example of a pixel according to a third embodiment of the present disclosure. FIG. 10 is a diagram illustrating a configuration example of a pixel 100 similarly to FIG. 3. This pixel 100 is different from the pixel 100 described with reference to FIG. 3 in that an in-layer lens having a shape other than a circular shape is arranged. A in FIG. 10 illustrates an example of arranging an in-layer lens 161 having an elliptical shape in a plan view, besides the in-layer lens 160. In addition, B in FIG. 10 illustrates another arrangement example of the in-layer lenses 160 and 161. In this manner, it is possible to arrange the in-layer lenses 160 and 161 having mutually different shapes in the pixel 100.
[Configuration of Pixel 2]
FIG. 11 is a plan view illustrating a second configuration example of the pixel according to the third embodiment of the present disclosure. FIG. 11 illustrates an example of arranging the in-layer lenses 161, or the in-layer lenses 160 and 161, while optimizing their sizes to make the gap 169 small. A in FIG. 11 illustrates an example of arranging two in-layer lenses 161. In addition, B and C in FIG. 11 each illustrate an example of arranging the in-layer lenses 160 and 161. Any of the arrangements in FIG. 11 can make the gap 169 smaller than the gap 169 by the arrangements of the in-layer lenses 160 and 161 in FIG. 10.
[Configuration of Pixel 3]
FIG. 12 is a plan view illustrating a third configuration example of the pixel according to the third embodiment of the present disclosure. FIG. 12 illustrates an example of arranging an in-layer lens 162 having a rectangular shape in a plan view. In addition, B in FIG. 12 illustrates an example of a case of arranging in-layer lenses 162 respectively having a square shape and an oblong shape in a pan view in combination. In this manner, arranging the in-layer lens 162 having the rectangular shape can make the gap 169 smaller than the gap 169 in the case of arranging the in-layer lens 160 having the circular shape.
[Configuration of Pixel 4]
FIG. 13 is a plan view illustrating a fourth configuration example of the pixel according to the third embodiment of the present disclosure. A in FIG. 13 illustrates an example of arranging an in-layer lens 163 and the in-layer lens 160, and B in FIG. 13 illustrates a diagram illustrating a shape of a section of the in-layer lenses. The in-layer lens 163 is an in-layer lens that has an opening portion in its central portion in a plan view and that has a shape obtained by halving a torus in a thickness direction. The in-layer lens 160 illustrated in FIG. 13 is arranged in the opening portion of the in-layer lens 163. In this manner, arranging the in-layer lenses 160 and 163 in combination can make the gap 169 smaller.
Since a configuration of the imaging element 1 other than the above is similar to the configuration of the imaging element 1 described in the first embodiment of the present disclosure, a description thereof is omitted.

As described above, in the imaging element 1 according to the third embodiment of the present disclosure, arranging the in-layer lenses 160 to 163 having different shapes can make the gap 169 smaller, and thus can scatter a larger amount of incident light.

4. Fourth Embodiment

Figure 14:
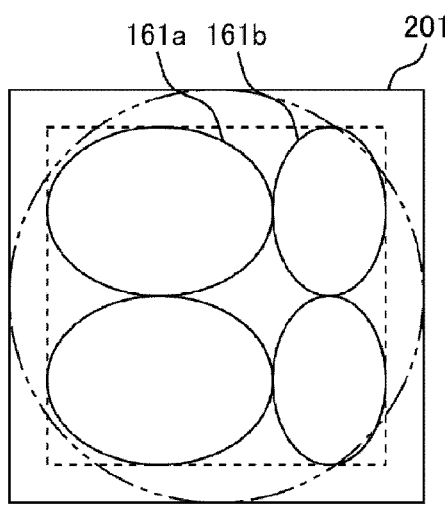
FIG. 14 is a plan view illustrating a configuration example of a pixel according to a fourth embodiment of the present disclosure.
Figure 14:
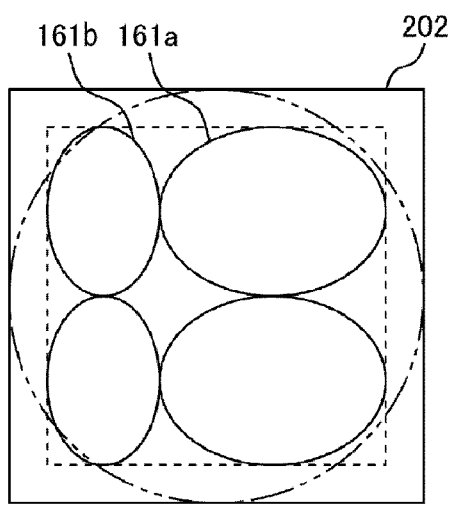
Figure 15:
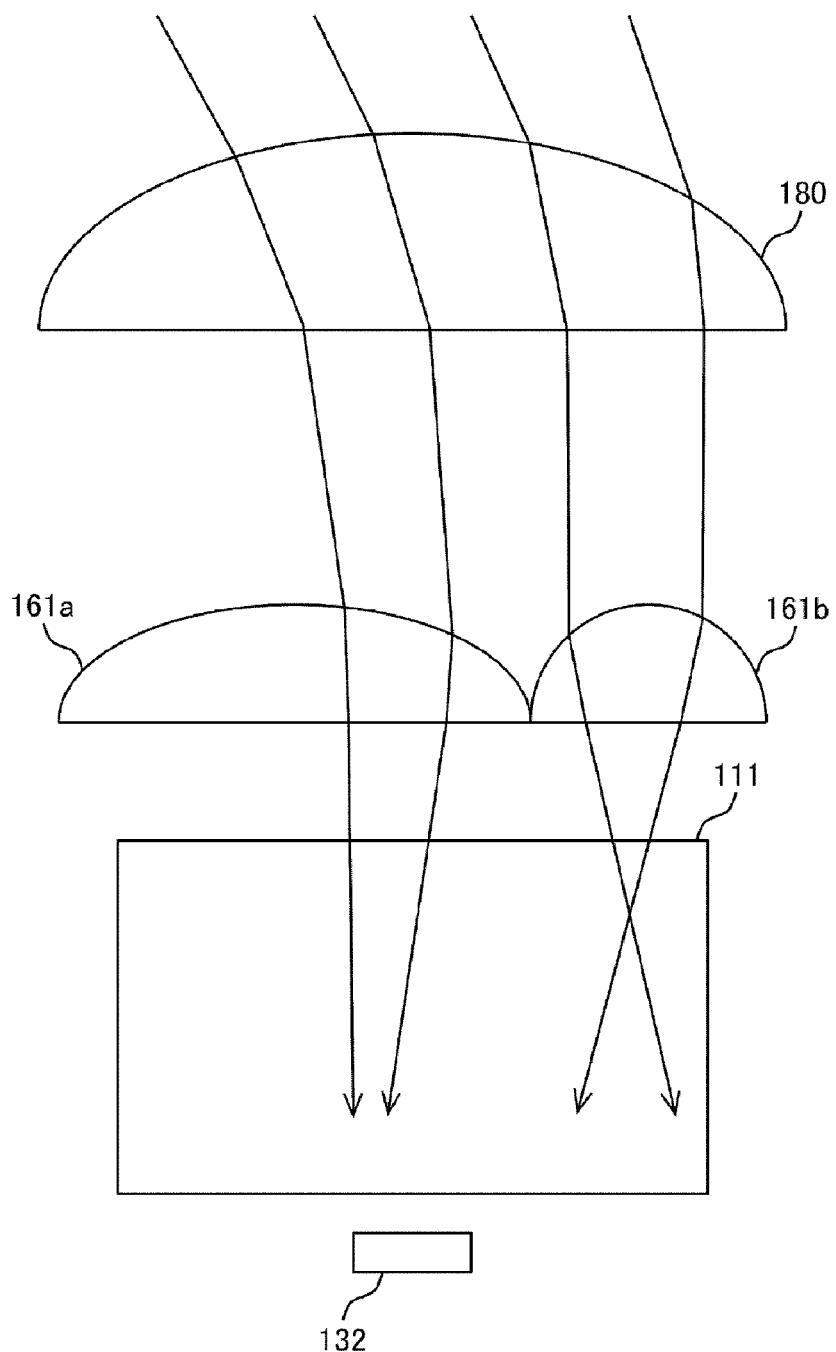
FIG. 15 is a diagram illustrating an example of a light path of incident light in the pixel according to the fourth embodiment.

In the imaging element 1 according to the first embodiment described above, the in-layer lenses 160 arranged symmetrically about the center of the pixel 100 are used. In contrast, an imaging element 1 according to a fourth embodiment of the present disclosure is different from the first embodiment described above in that in-layer lenses arranged asymmetrically about the center of the pixel 100 are used.
[Configuration of Pixel]
FIG. 14 is a plan view illustrating a configuration example of a pixel according to a fourth embodiment of the present disclosure. FIG. 14 is a diagram illustrating a configuration example of a pixel 100 similarly to FIG. 3. The pixel illustrated in FIG. 14 is different from the pixel 100 described with reference to FIG. 3 in that the in-layer lenses are arranged asymmetrically about the center of the pixel. Pixels (pixels 201 and 202) in FIG. 14 are illustrated as an example of arranging four in-layer lenses 161 having different shapes. Specifically, as the pixels illustrated in FIG. 14, two in-layer lenses 161a each having a relatively large size, and two in-layer lenses 161b each having a relatively small size are arranged. As a result, the in-layer lenses 161 are arranged asymmetrically about the center of the pixel 100, and incident light can be scattered asymmetrically. The pixel 201 illustrated in A in FIG. 14 and the pixel 202 illustrated in B in FIG. 14 are configured by changing the arrangement of the in-layer lenses 161a and 161b by 180 degrees from each other. The pixels 201 and 202 are arranged in an end portion of the pixel array unit 10 described with reference to FIG. 1. Specifically, the pixel 201 illustrated in A in FIG. 14 is arranged at a right end of the pixel array unit 10, and the pixel 202 illustrated in B in FIG. 14 is arranged at a left end of the pixel array unit 10. Incident light is emitted obliquely to the pixels at an end portion of the pixel array unit 10 in accordance with an image height of the subject. Thus, arranging the in-layer lenses 161 asymmetrically can reduce an influence by the image height.
[Light Path of Incident Light]
FIG. 15 is a diagram illustrating an example of a light path of incident light in the pixel according to the fourth embodiment of the present disclosure. FIG. 15 is a diagram illustrating the light path of incident light in the pixel 201. As described above, the pixel 201 is arranged at the right end of the pixel array unit 10. For this reason, incident light is incident on the pixel 201 obliquely from the upper left of the drawing. Thus, the plurality of in-layer lenses 161 is arranged by being shifted to the right side of the drawing in the pixel 201 and the in-layer lens 161 on the left side is horizontally long. This arrangement can collect obliquely incident light on a central portion of the pixel 201 and also scatter the obliquely incident light.
Since a configuration of the imaging element 1 other than the above is similar to the configuration of the imaging element 1 described in the first embodiment of the present disclosure, a description thereof is omitted.

As described above, the imaging element 1 according to the fourth embodiment of the present disclosure includes the in-layer lenses arranged asymmetrically about the center of the pixel, thereby enabling obliquely incident light to be collected on the central portion and also scattered in the pixel.

5. Fifth Embodiment

In the imaging element 1 according to the first embodiment, the in-layer lens 160 is arranged in all the pixels 100 in the pixel array unit 10. In contrast, an imaging element 1 according to a fifth embodiment of the present disclosure is different from the first embodiment in that the in-layer lens 160 is arranged in the pixel 100 in which the color filter 172 corresponding to incident light having a long wavelength is arranged.

[Configuration of Pixel]

Figure 16:
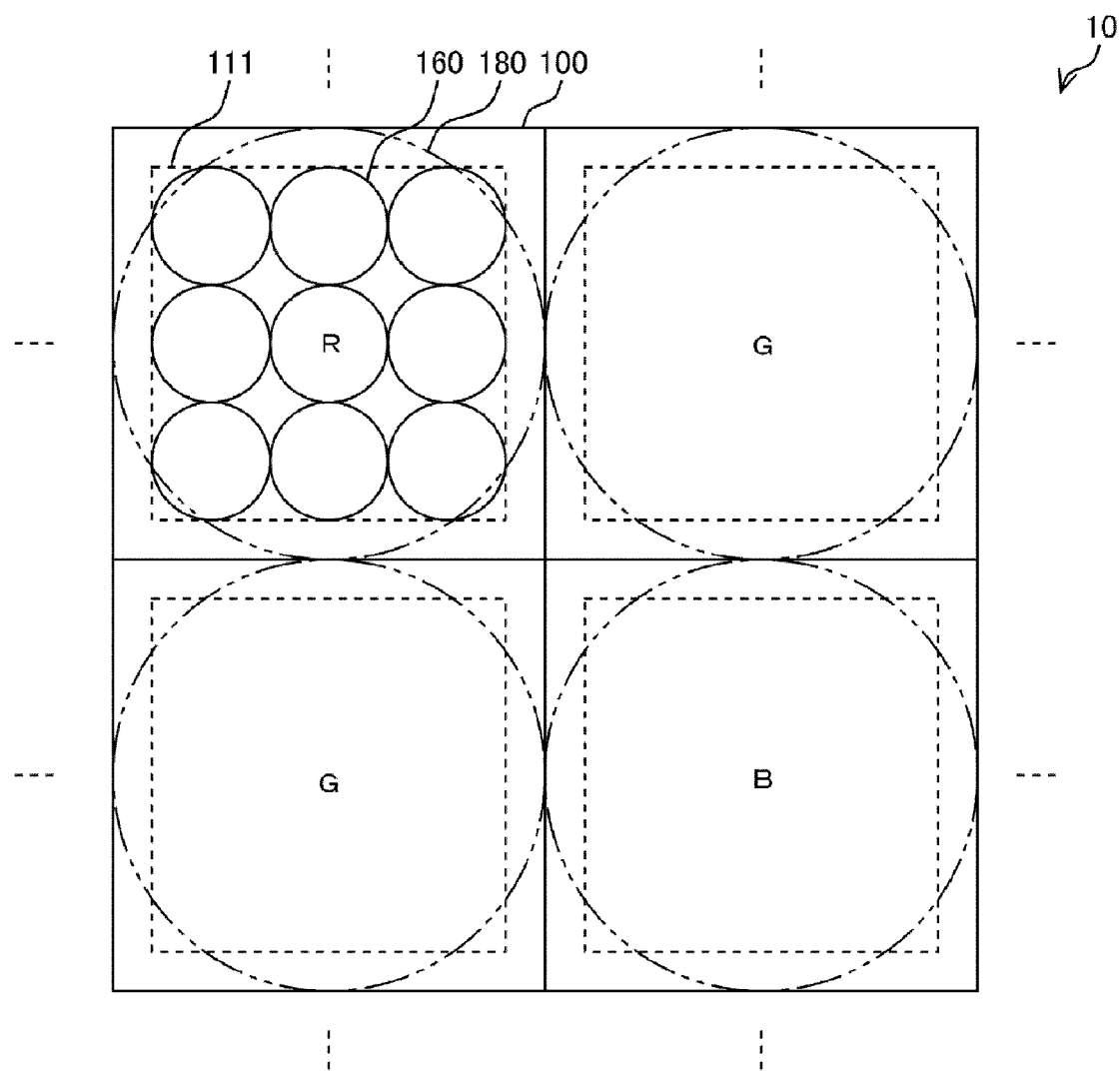
FIG. 16 is a plan view illustrating a configuration example of a pixel according to a fifth embodiment of the present disclosure.

FIG. 16 is a plan view illustrating a configuration example of a pixel according to a fifth embodiment of the present disclosure. The pixel 100 illustrated in FIG. 16 is different from the pixel 100 described with reference to FIG. 3 in that the in-layer lens 160 is arranged in the pixel 100 in which the color filter 172 corresponding to red light is arranged. Since red light has a long wavelength as described above, it reaches a deep portion of the semiconductor substrate 110. Accordingly, an amount of light reflected by the wiring layer 132 increases. In contrast, green light or blue light having a short wavelength is collected on a region at a relatively shallow position of the semiconductor substrate 110. For this reason, an amount of light reflected by the wiring layer 132 becomes relatively small. Thus, the in-layer lens 160 is arranged in the pixel 100 in which the color filter 172 corresponding to red light is arranged, and the in-layer lens 160 is not arranged in the pixel 100 in which the color filter 172 corresponding to green light or blue light is arranged. This can simplify the configuration of the imaging element 1.

[Another Configuration of Pixel]

Figure 17:
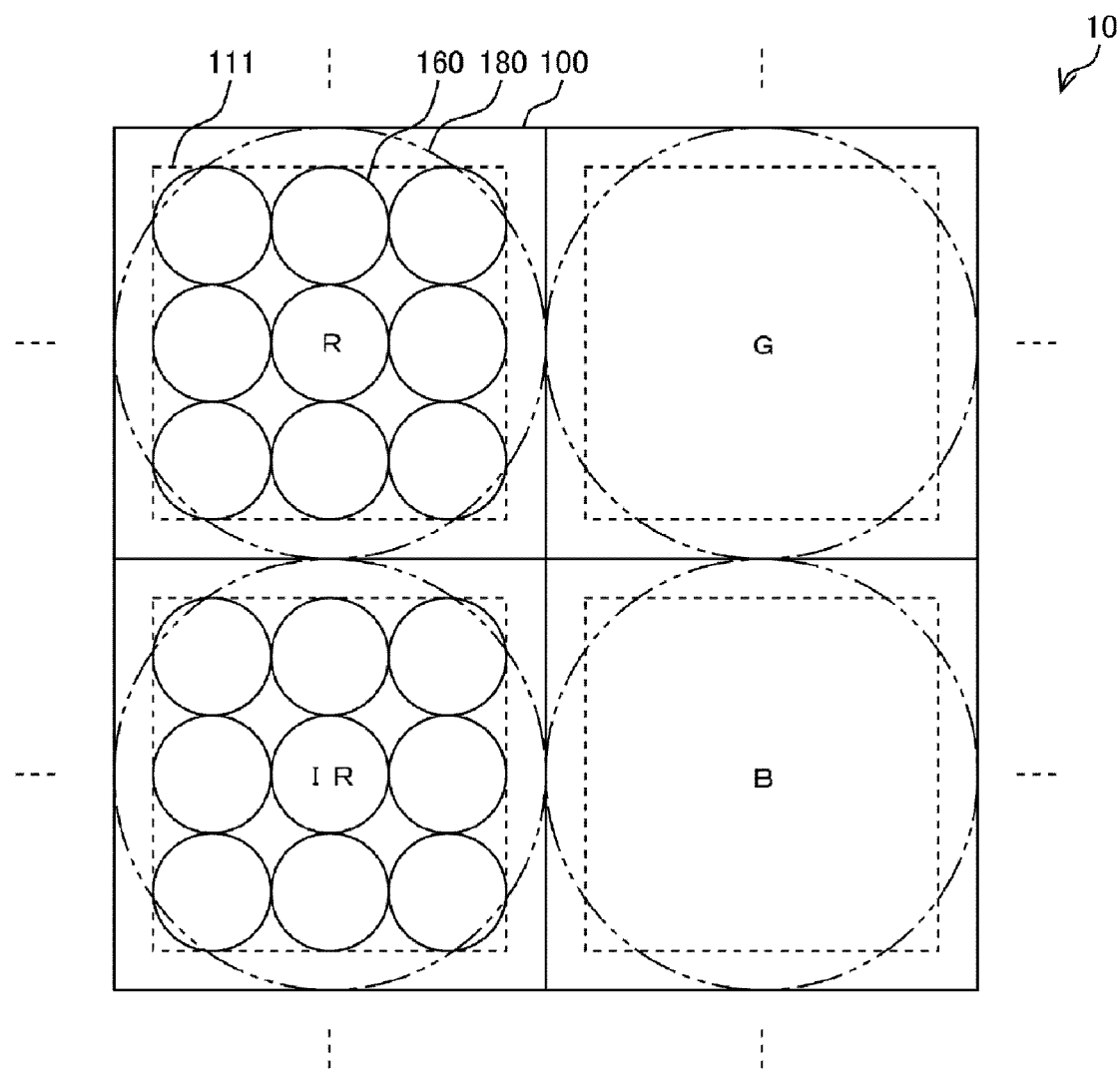
FIG. 17 is a plan view illustrating another configuration example of the pixel according to the fifth embodiment of the present disclosure.

FIG. 17 is a plan view illustrating another configuration example of the pixel according to the fifth embodiment of the present disclosure. FIG. 17 is different from the pixel 100 described with reference to FIG. 3 in that the pixel 100 in which a color filter 172 corresponding to infrared light is arranged is further included. The color filter 172 corresponding to infrared light is a color filter 172 that allows infrared light to pass therethrough. In FIG. 17, the pixel 100 denoted by "IR" indicates the color filter 172 corresponding to infrared light. The pixel 100 in which the color filter 172 corresponding to infrared light is arranged can be allocated to one of pixels 100 in which two color filters 172 corresponding to green light in the Bayer array are arranged. Arranging the in-layer lens 160 also in the pixel 100 in which the color filter 172 corresponding to infrared light having the long wavelength is arranged can scatter incident light.

Since a configuration of the imaging element 1 other than the above is similar to the configuration of the imaging element 1 described in the first embodiment of the present disclosure, a description thereof is omitted.

As described above, in the imaging element 1 according to the fifth embodiment of the present disclosure, arranging the in-layer lens 160 in the pixel in accordance with a wavelength of incident light can simplify the configuration of the imaging element 1.

6. Sixth Embodiment

In the imaging element 1 according to the first embodiment, only the pixel 100 is arranged in the pixel array unit 10. In contrast, an imaging element 1 according to a sixth embodiment of the present disclosure is different from the first embodiment in that a phase difference pixel to detect an image plane phase difference of the subject is further arranged.

[Configuration of Pixel Array Unit]

Figure 18:
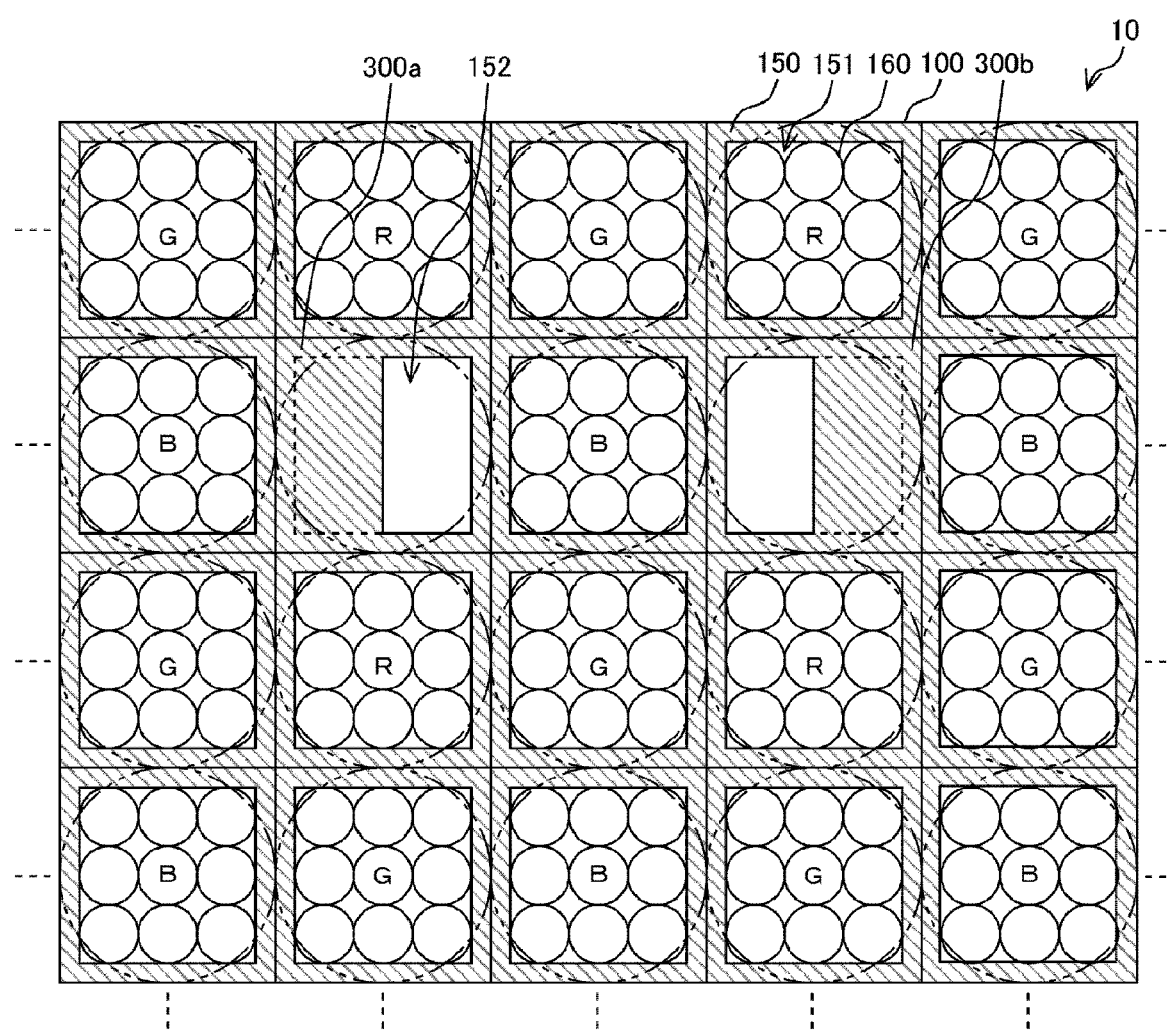
FIG. 18 is a plan view illustrating a configuration example of a pixel array unit according to a sixth embodiment of the present disclosure.

FIG. 18 is a plan view illustrating a configuration example of a pixel array unit according to a sixth embodiment of the present disclosure. A pixel array unit 10 illustrated in FIG. 18 is different from the pixel array unit 10 described with reference to FIG. 3 in that a phase difference pixel 300, besides the pixel 100, is arranged. The phase difference pixel 300 mentioned herein is a pixel to detect the image plane phase difference of the subject. The imaging element 1 is used together with an image taking lens arranged outside, and an image of the subject is formed by the image taking lens on the pixel array unit 10 of the imaging element 1. Detecting a phase difference of the subject whose image is formed enables detection of a focal position of the subject, thereby enabling autofocus to adjust a position of the image taking lens.

FIG. 18 illustrates an arrangement of the light-shielding film 150. As illustrated in FIG. 18, the light-shielding film 150 having an opening portion 152, instead of the opening portion 151, is arranged in the phase difference pixel 300. With this arrangement, the light-shielding film 150 is arranged to cover a left half or right half of the photoelectric conversion unit 101 in the phase difference pixel 300. In FIG. 18, the light-shielding film 150 shields the left half and right half of the photoelectric conversion unit 101 from light in the phase difference pixels 300a and 300b, respectively. With this arrangement, incident light, which has passed through the left side and right side of the image taking lens in the phase difference pixels 300a and 300b, respectively, reaches the photoelectric conversion unit 101, and respective image signals are generated. Such processing is called pupil division. A plurality of phase difference pixels 300a and a plurality of 300b are arranged in the pixel array unit 10. Two images are generated on the basis of respective image signals generated by the plurality of phase difference pixels 300a and the plurality of phase difference pixels 300b. Subsequently, detecting a phase difference between the two images enables detection of the focal position of the image taking lens.

In these phase difference pixels 300, omitting the in-layer lens 160 can increase accuracy in pupil division. This is because incident light subjected to pupil division is not scattered by the in-layer lens 160. This can reduce an error in detection of a phase difference.

Since a configuration of the imaging element 1 other than the above is similar to the configuration of the imaging element 1 described in the first embodiment of the present disclosure, a description thereof is omitted.

As described above, in the case of detecting the image plane phase difference, the imaging element 1 according to the sixth embodiment of the present disclosure scatters incident light in the pixel 100, and also can reduce an error in detection of a phase difference by the phase difference pixel 300.

7. Examples of Practical Use for Camera

The technology according to the present disclosure (the present technology) can be applied to various products. For example, the present technology may be implemented as an imaging element mounted on an imaging apparatus such as a camera.

Figure 19:
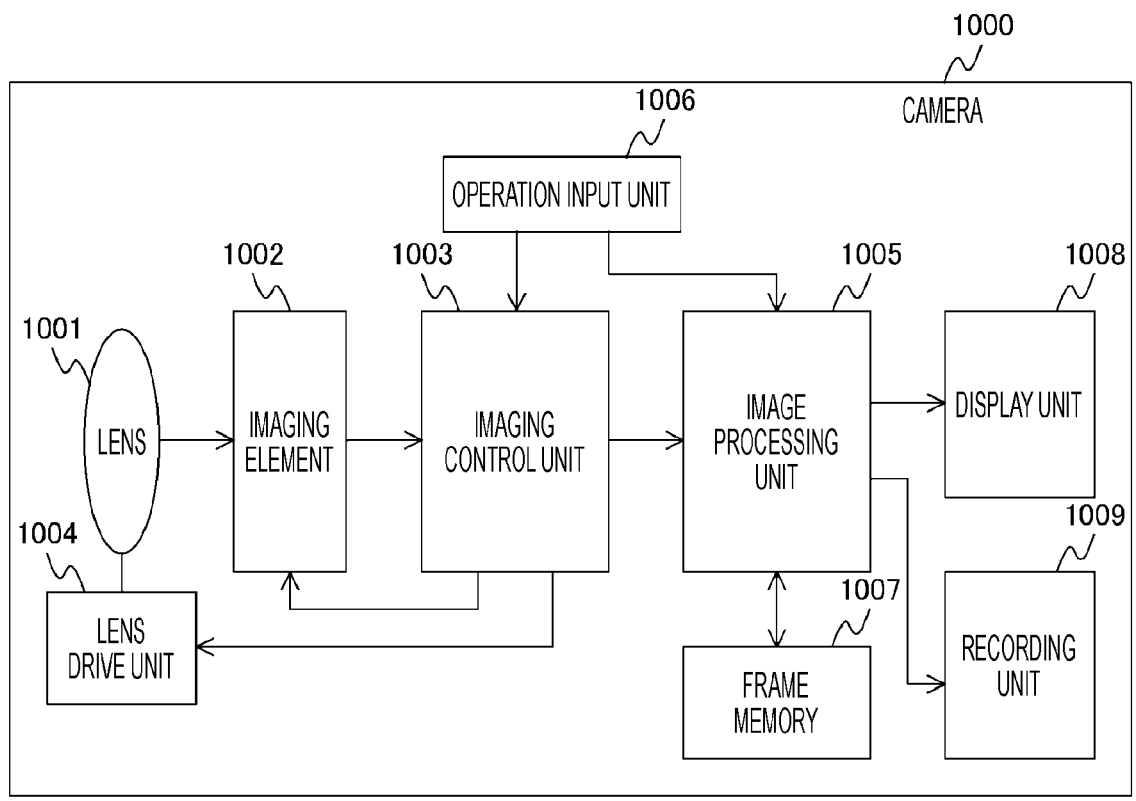
FIG. 19 is a block diagram illustrating a schematic configuration example of a camera as an example of an imaging apparatus to which the present technology can be applied.

FIG. 19 is a block diagram illustrating a schematic configuration example of a camera as an example of an imaging apparatus to which the present technology can be applied. A camera 1000 illustrated in FIG. 19 includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an image taking lens of the camera 1000. This lens 1001 collects light from the subject and allows the light to be incident on the imaging element 1002, which will be described later, to form an image of the subject.

The imaging element 1002 is a semiconductor element that images light reflected from the subject and collected by the lens 1001. This imaging element 1002 generates an analog image signal in accordance with irradiated light, converts the analog image signal to a digital image signal, and outputs the digital image signal.

The imaging control unit 1003 controls imaging in the imaging element 1002. This imaging control unit 1003 controls the imaging element 1002 by generating a control signal and outputting the control signal to the imaging element 1002. In addition, the imaging control unit 1003 can perform autofocus in the camera 1000 on the basis of the image signal output from the imaging element 1002. The autofocus mentioned herein is a system to detect and automatically adjust a focal position of the lens 1001. As this autofocus, it is possible to use a method of detecting the focal position by causing a phase difference pixel arranged in the imaging element 1002 to detect an image plane phase difference (image plane phase difference autofocus). In addition, it is also possible to apply a method of detecting a position that allows an image to have the highest contrast (contrast autofocus) as the focal position. The imaging control unit 1003 adjusts the position of the lens 1001 via the lens drive unit 1004 on the basis of the detected focal position, and performs the autofocus. Note that the imaging control unit 1003 can be configured by, for example, a digital signal processor (DSP) that comes with firmware.

The lens drive unit 1004 drives the lens 1001 on the basis of control by the imaging control unit 1003. This lens drive unit 1004 can drive the lens 1001 by changing the position of the lens 1001 using a built-in motor.

The image processing unit 1005 performs processing on an image signal generated by the imaging element 1002. This processing corresponds to, for example, demosaicing to generate an image signal of a lacking color among image signals corresponding to red, green, and blue on a pixel-by-pixel basis, noise reduction to remove noise in the image signal, and encoding of the image signal. The image processing unit 1005 can be configured by, for example, a microcomputer that comes with firmware.

The operation input unit 1006 accepts input of an operation from a user of the camera 1000. For example, a push button or a touch panel can be used for this operation input unit 1006. The input of the operation accepted by the operation input unit 1006 is transmitted to the imaging control unit 1003 and the image processing unit 1005. Thereafter, processing in accordance with the input of the operation, for example, processing such as imaging of the subject is activated.

The frame memory 1007 is a memory that stores a frame, which is an image signal for one screen. This frame memory 1007 is controlled by the image processing unit 1005, and holds the frame in the course of the image processing.

The display unit 1008 displays an image processed by the image processing unit 1005. For example, a liquid crystal panel can be used for this display unit 1008.

The recording unit 1009 records an image processed by the image processing unit 1005. For example, a memory card or a hard disk can be used for this recording unit 1009.

The description has been given of the camera to which the present disclosure can be applied. The present technology can be applied to the imaging element 1002 among the configurations described above. Specifically, the imaging element 1 described with reference to FIG. 1 can be applied to the imaging element 1002. Applying the imaging element 1 to the imaging element 1002 reduces occurrence of color mixture, and thus can prevent degradation of image quality of an image generated by the camera 1000. Note that the image processing unit 1005 is one example of a processing circuit described in the claims. The camera 1000 is one example of an imaging apparatus described in the claims.

Note that the description has been given of the camera as one example, but the technology according to the present disclosure may be applied to another apparatus, for example, a monitoring apparatus.

8. Examples of Practical Use for Endoscopic Surgery System

The technology (present technology) according to an embodiment of the present disclosure is applicable to a variety of products. For example, the technology according to the present disclosure may be applied to an endoscopic surgery system.

Figure 20:
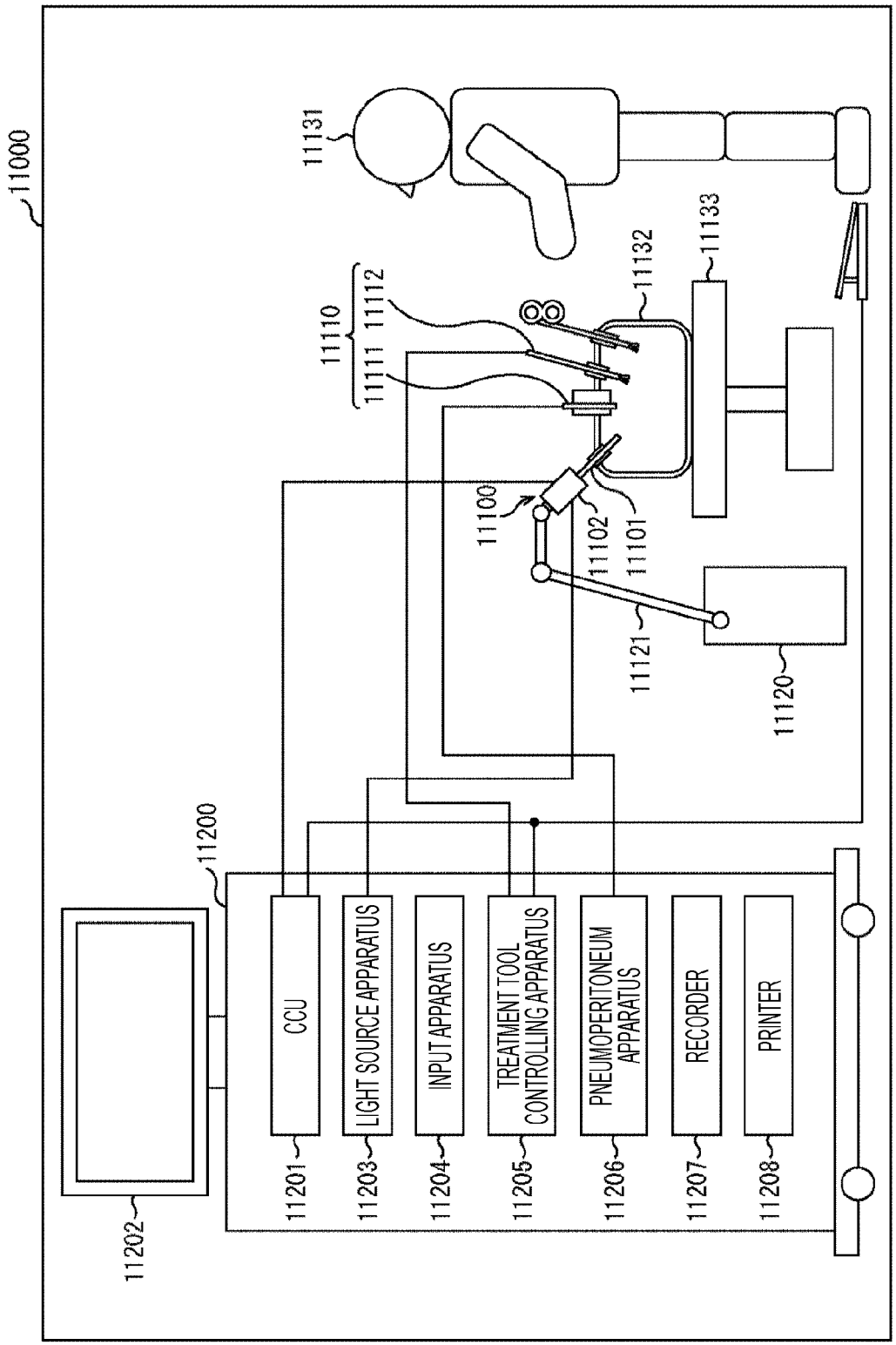
FIG. 20 is a view depicting an example of a schematic configuration of an endoscopic surgery system.

FIG. 20 is a view depicting an example of a schematic configuration of an endoscopic surgery system to which the technology according to the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which is included as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region and the like to the endoscope 11100.

An input apparatus 11204 is an input interface for the endoscopic surgery system 11000. A user can perform input of various kinds of information or instruction inputting to the endoscopic surgery system 11000 through the input apparatus 11204. For example, the user would input an instruction or the like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. In a case where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the imaging elements of the camera head 11102 are controlled in synchronism with the irradiation timings, it is also possible to time-divisionally capture images corresponding to respective R, G and B. According to the method just described, a color image can be obtained even if a color filter is not provided for the imaging element.

Further, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light of a body tissue, narrow band light observation (narrow band imaging) of imaging a certain tissue such as a blood vessel of a superficial portion of the mucous membrane or the like in a high contrast is performed by applying light of a narrower wavelength band in comparison with irradiation light upon ordinary observation (namely, white light). Alternatively, in special light observation, fluorescent observation for obtaining an image from fluorescent light generated by irradiation of excitation light may also be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue, for example. The light source apparatus 11203 can be configured to supply such narrowband light and/or excitation light suitable for special light observation as described above.

Figure 21:
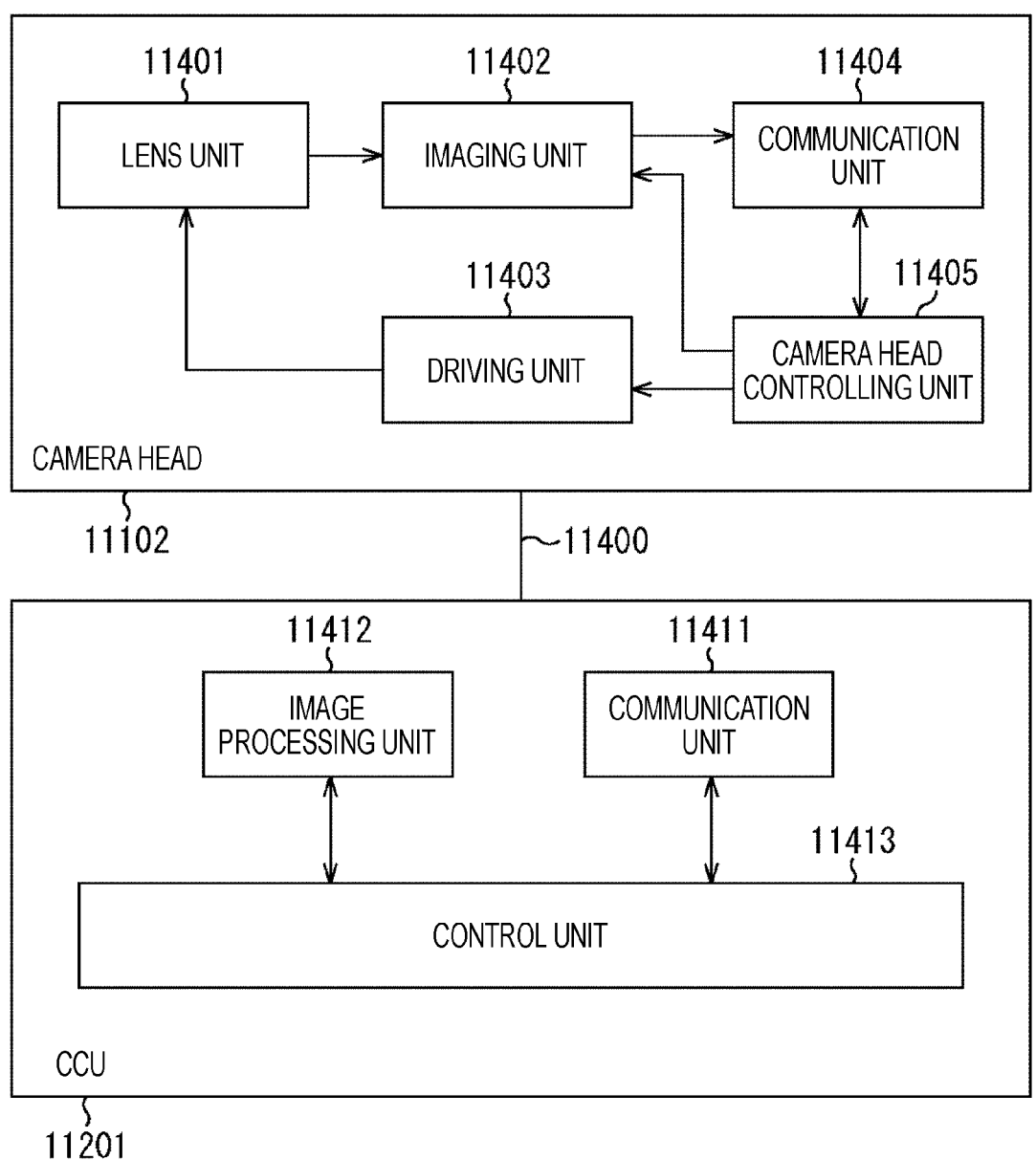
FIG. 21 is a block diagram depicting an example of a functional configuration of the camera head and the CCU.

FIG. 21 is a block diagram depicting an example of a functional configuration of the camera head 11102 and the CCU 11201 depicted in FIG. 20.

The camera head 11102 includes a lens unit 11401, an imaging unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (so-called single-plate type) or a plural number (so-called multi-plate type). In a case where the imaging unit 11402 is configured as that of the multi-plate type, for example, image signals corresponding to respective R, G, and B are generated by the imaging elements, and the image signals may be synthesized to obtain a color image. The imaging unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, in a case where the imaging unit 11402 is configured as that of multi-plate type, a plurality of systems of lens units 11401 is provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information regarding imaging conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be appropriately designated by the user or may be set automatically by the control unit 11413 of the CCU 11201 on the basis of an acquired image signal. In the latter case, an auto exposure AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description above is given of an example of the endoscopic surgery system to which the technology according to the present disclosure is applicable. The technology according to the present disclosure can be applied to the imaging unit 11402 among the configurations described above. Specifically, the imaging element 1 illustrated in FIG. 1 can be applied to the imaging unit 10402. Applying the present technology according to the present disclosure to the imaging unit 10402 enables acquisition of an image of the operated part with high image quality, thereby enabling the operator to unfailingly check the operated part.

Note that the description has been given of the endoscopic surgery system as an example, but the technology according to the present disclosure may be applied to another system, for example, a micrographic surgery system.

9. Examples of Practical Use for Mobile Objects

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 22:
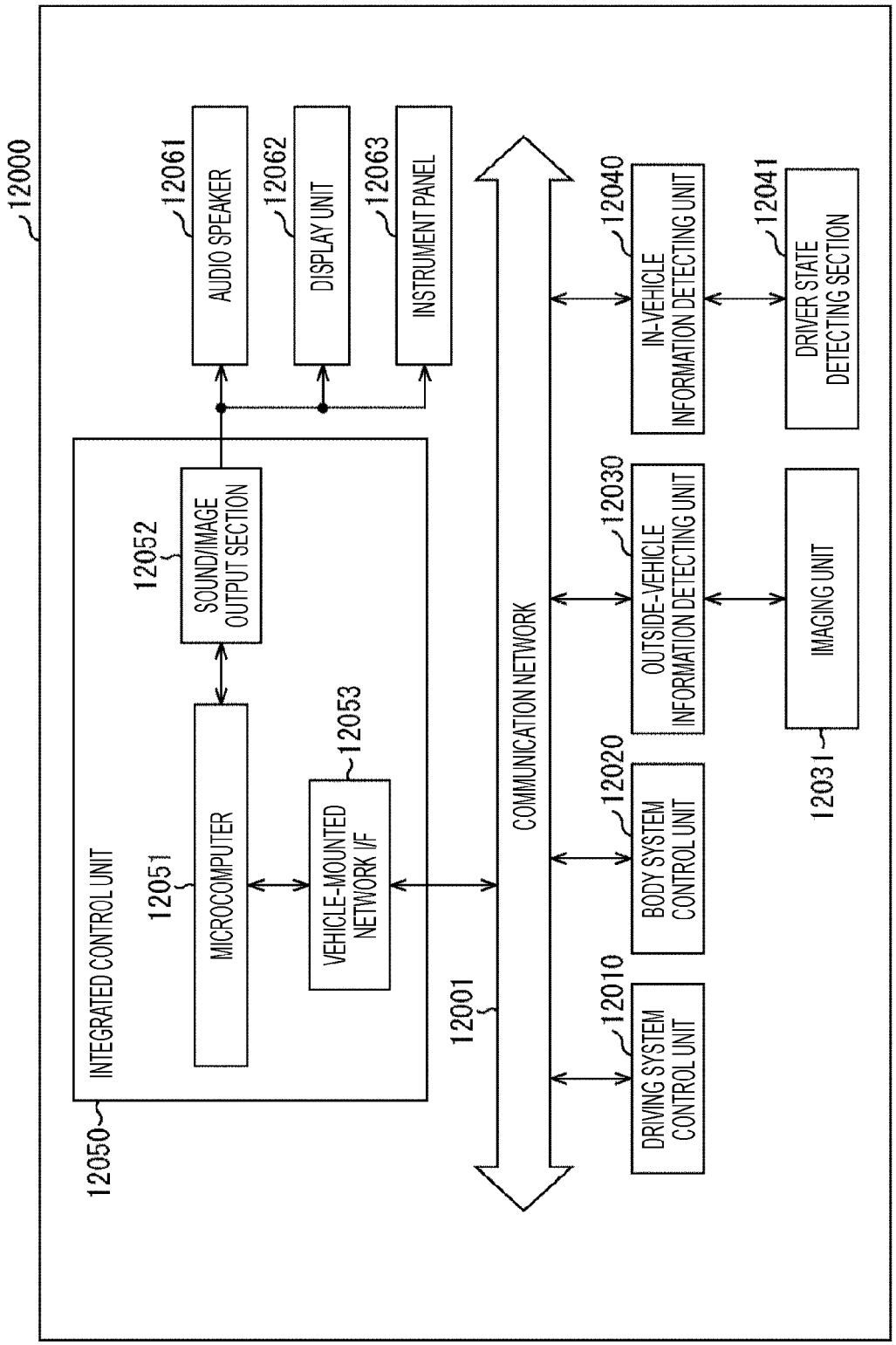
FIG. 22 is a block diagram depicting an example of schematic configuration of a vehicle control system.

FIG. 22 is a block diagram depicting an example of schematic configuration of a vehicle control system as an example of a mobile object control system to which the technology according to the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output section 12052, a vehicle-mounted network interface (I/F) 12053 are shown.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electrical signal corresponding to a received light amount of the light. The imaging unit 12031 can output the electrical signal as an image, or can output the electrical signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether or not the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying an occupant of the vehicle or the outside of the vehicle of information. In the example of FIG. 22, an audio speaker 12061, a display unit 12062, and an instrument panel 12063 are illustrated as the output device. The display unit 12062 may, for example, include at least one of an on-board display and a head-up display.

Figure 23:
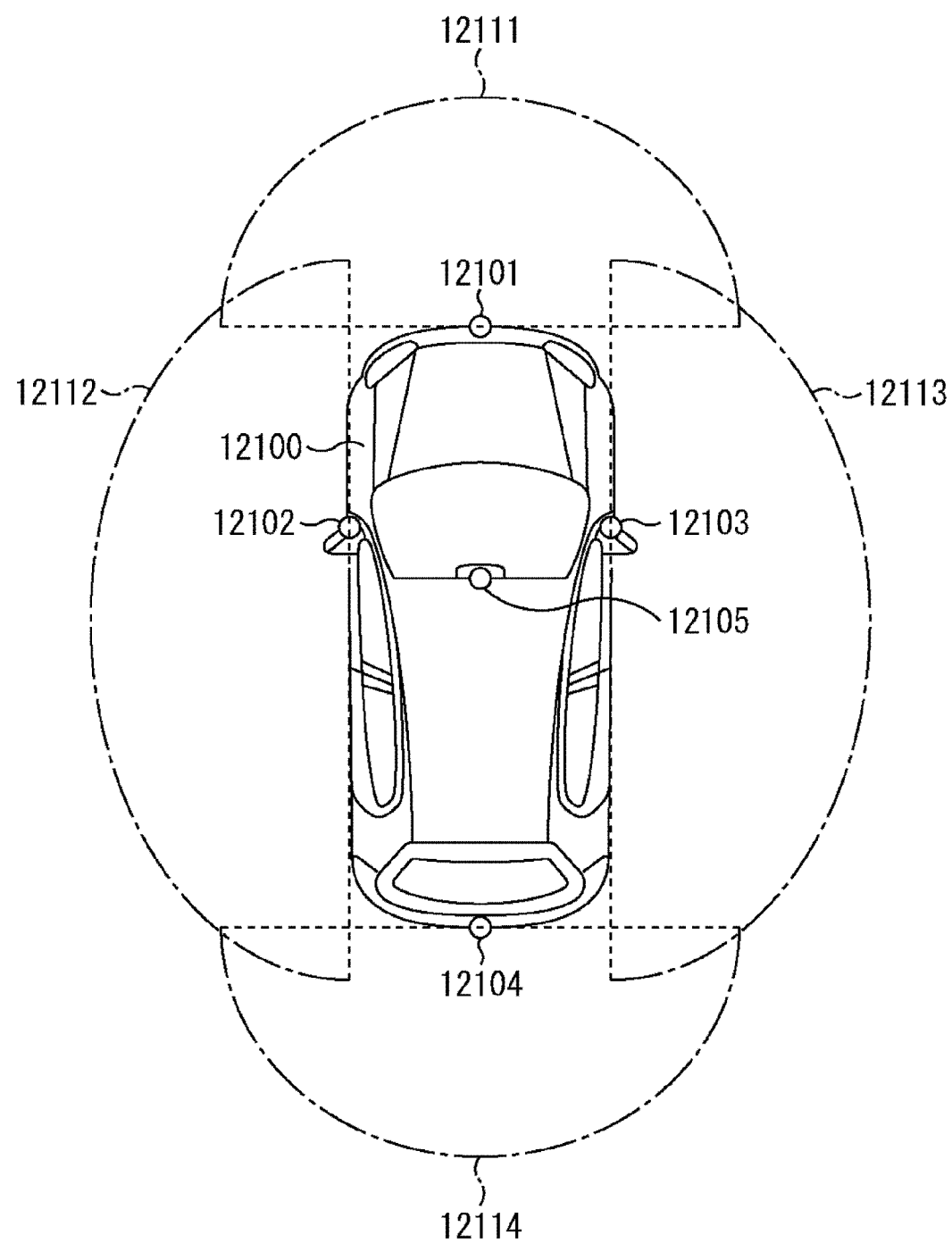
FIG. 23 is a diagram of assistance in explaining an example of installation positions of an outside-vehicle information detecting section and an imaging unit.

FIG. 23 is a diagram depicting an example of the installation position of the imaging unit 12031.

In FIG. 23, the vehicle 12100 includes imaging units 12101, 12102, 12103, 12104, and 12105 as the imaging unit 12031.

imaging units 12101, 12102, 12103, 12104, and 12105 are positioned, for example, at the front nose, a side mirror, the rear bumper, the back door, and the upper part, or the like, of the windshield in the vehicle compartment of the vehicle 12100. The imaging unit 12101 provided to the front nose and the imaging unit 12105 provided to the upper portion of the windshield within the interior of the vehicle obtain mainly an image of the front of the vehicle 12100. The imaging units 12102 and 12103 attached to the side mirrors chiefly acquire images of the areas on the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Incidentally, FIG. 23 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the side view mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/h). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output section 12052 controls the display unit 12062 so that a square contour line for emphasis is displayed so as to be superimposed on the recognized pedestrian. Further, the sound/image output section 12052 may also control the display unit 12062 so that an icon or the like representing the pedestrian is displayed at a desired position.

The description has been given of the example of the vehicle control system to which the technology according to the present disclosure can be applied. The technology according to the present disclosure can be applied to the imaging unit 12031 or the like among the configurations described above. Specifically, the imaging element 1 illustrated in FIG. 1 can be applied to the imaging unit 12031. Applying the technology according to the present disclosure to the imaging unit 12031 enables acquisition of a taken image with high image quality, thereby enabling reduction of fatigue of the driver.

Finally, the above description of each of the embodiments is one example of the present disclosure, and the present disclosure is not limited to the embodiments described above. Thus, it is a matter of course that even if an embodiment is other than the embodiments described above, various modifications can be made in accordance with design or the like without departing from the technical idea of the present disclosure.

In addition, the drawings of the embodiments described above are schematic drawings, and a dimensional ratio of each unit or the like does not necessarily match with the actual one. Furthermore, it is a matter of course that a part having a different dimensional relationship or a different dimensional ratio between the drawings is included.

Additionally, the present technology may also be configured as below.

(1) An imaging element including:
an on-chip lens configured to collect incident light from a subject;
a photoelectric conversion unit configured to perform photoelectric conversion on the collected incident light; and
a plurality of in-layer lenses that is arranged between the on-chip lens and the photoelectric conversion unit and that is configured to further collect the incident light that has passed through the on-chip lens,
in which the plurality of in-layer lenses is configured to allow the incident light that has passed through any one of the plurality of in-layer lenses to be incident on the photoelectric conversion unit.

(2) The imaging element according to (1), in which the plurality of in-layer lenses is arranged in substantially an identical layer.

(3) The imaging element according to (2), in which the plurality of in-layer lenses is simultaneously formed.

(4) The imaging element according to any one of (1) to (3), further including a color filter configured to allow light having a predetermined wavelength, out of the incident light that has passed through the on-chip lens, to transmit through the color filter.

(5) The imaging element according to (4), in which the color filter is configured to allow red light to transmit through the color filter.

(6) The imaging element according to (4), in which the color filter is configured to cause infrared light to transmit through the color filter.

(7) The imaging element according to any one of (1) to (6), in which one of the plurality of in-layer lenses is arranged on an optical axis of the on-chip lens.

(8) The imaging element according to any one of (1) to (7), in which the plurality of in-layer lenses has mutually different shapes.

(9) The imaging element according to any one of (1) to (8), further including a plurality of pixels each including the on-chip lens, the photoelectric conversion unit, and the plurality of in-layer lenses.

(10) The imaging element according to (9), in which the plurality of in-layer lenses is arranged asymmetrically about a center of the pixel.

(11) The imaging element according to (9), further including a phase difference pixel that includes the on-chip lens and the photoelectric conversion unit, and that is configured to detect a phase difference by performing pupil division on the incident light from the subject.

(12) An imaging apparatus including:
an on-chip lens configured to collect incident light from a subject;
a photoelectric conversion unit configured to perform photoelectric conversion on the collected incident light;
a plurality of in-layer lenses that is arranged between the on-chip lens and the photoelectric conversion unit and that is configured to further collect the incident light that has passed through the on-chip lens; and
a processing circuit configured to process an image signal on the basis of the photoelectric conversion in the photoelectric conversion unit,
in which the plurality of in-layer lenses is configured to allow the incident light that has passed through any one of the plurality of in-layer lenses to be incident on the photoelectric conversion unit.

REFERENCE SIGNS LIST

1 Imaging element
10 Pixel array unit
30 Column signal processing unit
100, 201, 202 Pixel
101 Photoelectric conversion unit
111 n-type semiconductor region
132 Wiring layer
150 Light-shielding film
160, 160a, 160b, 161, 161a, 161b, 162, 163 In-layer lens
172 Color filter
180 On-chip lens
300, 300a, 300b Phase difference pixel
1000 Camera
1002 Imaging element
10402, 12031, 12101 to 12105 Imaging unit

The invention claimed is:
1. An imaging element comprising:
an on-chip lens configured to collect incident light from a subject, the on-chip lens having an edge in a plan view;
a photoelectric conversion unit configured to perform photoelectric conversion on the collected incident light;
a plurality of in-layer lenses that is arranged between the on-chip lens and the photoelectric conversion unit and that is configured to further collect the incident light that has passed through the on-chip lens, the plurality of in-layer lenses including an array of three in-layer lenses arranged in first and second directions; and
a plurality of gaps arranged, in the plan view, between the in-layer lenses and within the edge of the on-chip lens, such that each of the plurality of gaps overlaps only a single photoelectric conversion unit,
wherein
a one-to-many relationship exists between the on-chip lens and the in-layer lenses in the plurality of in-layer lenses which correspond to the on-chip lens,
the plurality of in-layer lenses and the plurality of gaps are configured to allow the incident light that has passed through either any one of the plurality of in-layer lenses or any one of the plurality of gaps to be incident on the photoelectric conversion unit,
each in-layer lens in the plurality of in-layer lenses is in direct contact with at least two adjacent in-layer lenses, and a space exists, in the plan view, between an edge of the photoelectric conversion unit and the plurality of in layer lenses, and
each of the plurality of gaps has an irregular shape.

2. The imaging element according to claim 1, wherein the plurality of in-layer lenses is arranged in substantially an identical layer.

3. The imaging element according to claim 2, wherein the plurality of in-layer lenses is simultaneously formed.

4. The imaging element according to claim 1, further comprising a color filter configured to allow light having a predetermined wavelength, out of the incident light that has passed through the on-chip lens, to transmit through the color filter.

5. The imaging element according to claim 4, wherein the color filter is configured to allow red light to transmit through the color filter.

6. The imaging element according to claim 4, wherein the color filter is configured to cause infrared light to transmit through the color filter.

7. The imaging element according to claim 1, wherein one of the plurality of in-layer lenses is arranged on an optical axis of the on-chip lens.

8. The imaging element according to claim 1, wherein the plurality of in-layer lenses has mutually different shapes.

9. The imaging element according to claim 1, further comprising a plurality of pixels each including the on-chip lens, the photoelectric conversion unit, and the plurality of in-layer lenses.

10. The imaging element according to claim 9, wherein the plurality of in-layer lenses is arranged asymmetrically about a center of the pixel.

11. The imaging element according to claim 9, further comprising a phase difference pixel that includes the on-chip lens and the photoelectric conversion unit, and that is configured to detect a phase difference by performing pupil division on the incident light from the subject.

12. An imaging apparatus comprising:
an on-chip lens configured to collect incident light from a subject, the on-chip lens having an edge in a plan view;
a photoelectric conversion unit configured to perform photoelectric conversion on the collected incident light;
a plurality of in-layer lenses that is arranged between the on-chip lens and the photoelectric conversion unit and that is configured to further collect the incident light that has passed through the on-chip lens, the plurality of in-layer lenses including an array of three in-layer lenses arranged in first and second directions;
a plurality of gaps arranged, in the plan view, between the in-layer lenses and within the edge of the on-chip lens, such that each of the plurality of gaps overlaps only a single photoelectric conversion unit; and
a processing circuit configured to process an image signal on a basis of the photoelectric conversion in the photoelectric conversion unit,
wherein
a one-to-many relationship exists between the on-chip lens and the in-layer lenses in the plurality of in-layer lenses which correspond to the on-chip lens,
the plurality of in-layer lenses and the plurality of gaps are configured to allow the incident light that has passed through either any one of the plurality of in-layer lenses or any one of the plurality of gaps to be incident on the photoelectric conversion unit,
each in-layer lens in the plurality of in-layer lenses is in direct contact with at least two adjacent in-layer lenses, and a space exists, in the plan view, between an edge of the photoelectric conversion unit and the plurality of in layer lenses, and each of the plurality of gaps has an irregular shape.

13. The imaging element according to claim 1, wherein a ratio of a quantity of in-layer lenses to the on-chip lens is 9 to 1, and the in-layer lenses are located overlapping the on-chip lens and between the in-layer lenses are 4 gaps.

14. The imaging element according to claim 13, wherein the plurality of in-layer lenses is arranged symmetrically about a center of the on-chip lens.

* * * * *